United States Patent
Ota et al.

(10) Patent No.: US 8,883,026 B2
(45) Date of Patent: Nov. 11, 2014

(54) SUBSTRATE PROCESSING METHOD AND SUBSTRATE PROCESSING APPARATUS

(71) Applicant: Dainippon Screen Mfg. Co., Ltd., Kyoto (JP)

(72) Inventors: Takashi Ota, Kyoto (JP); Yuya Akanishi, Kyoto (JP); Akio Hashizume, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 13/687,454

(22) Filed: Nov. 28, 2012

(65) Prior Publication Data
US 2013/0256267 A1 Oct. 3, 2013

(30) Foreign Application Priority Data
Mar. 29, 2012 (JP) .................................. 2012-077130

(51) Int. Cl.
| | | |
|---|---|---|
| *C03C 15/00* | (2006.01) | |
| *H01L 21/67* | (2006.01) | |
| *B44C 1/22* | (2006.01) | |
| *H01L 21/311* | (2006.01) | |

(52) U.S. Cl.
CPC .......... *B44C 1/227* (2013.01); *H01L 21/67028* (2013.01); *H01L 21/31116* (2013.01); *H01L 21/6708* (2013.01); *H01L 21/67207* (2013.01)
USPC .......................... 216/62; 216/37; 156/345.15

(58) Field of Classification Search
USPC .................. 216/37, 62; 156/345.15
See application file for complete search history.

(56) References Cited

U.S. PATENT DOCUMENTS

| | | | |
|---|---|---|---|
| 5,279,705 A * | 1/1994 | Tanaka .......................... | 438/707 |
| 5,801,103 A | 9/1998 | Rasmussen et al. .......... | 438/753 |
| 5,954,911 A | 9/1999 | Bergman et al. .............. | 156/345 |
| 6,065,481 A | 5/2000 | Fayfield et al. ................ | 134/1.3 |
| 6,756,312 B2 | 6/2004 | Shintani et al. ............... | 438/706 |
| 7,297,639 B2 | 11/2007 | Rana .............................. | 438/756 |
| 7,361,228 B2 | 4/2008 | Choi et al. ..................... | 118/715 |
| 7,368,394 B2 | 5/2008 | Shen et al. ..................... | 438/722 |
| 7,481,886 B2 | 1/2009 | Kato et al. ..................... | 118/715 |
| 7,481,902 B2 | 1/2009 | Shinriki et al. ........... | 156/345.29 |
| 7,566,664 B2 | 7/2009 | Yan et al. ....................... | 438/706 |
| 7,645,704 B2 | 1/2010 | Shi et al. ....................... | 438/706 |
| 7,651,584 B2 | 1/2010 | Amikura .................. | 156/345.34 |
| 7,723,236 B2 | 5/2010 | Mochiki ....................... | 438/706 |
| 7,892,357 B2 | 2/2011 | Srivastava .................... | 118/715 |

(Continued)

FOREIGN PATENT DOCUMENTS

| | | |
|---|---|---|
| JP | 2003-031548 | 1/2003 |
| JP | 2007-258405 | 10/2007 |

(Continued)

*Primary Examiner* — Duy Deo
*Assistant Examiner* — Maki Angadi
(74) *Attorney, Agent, or Firm* — Ostrolenk Faber LLP

(57) ABSTRACT

A substrate processing method includes a water removing step of removing water from a substrate, a silylating step of supplying a silylating agent to the substrate after the water removing step, and an etching step of supplying an etching agent to the substrate after the silylating step. The substrate may have a surface on which a nitride film and an oxide film are exposed and in this case, the etching step may be a selective etching step of selectively etching the nitride film by the etching agent. The etching agent may be supplied in a form of a vapor having an etching component.

8 Claims, 14 Drawing Sheets

(56) References Cited

U.S. PATENT DOCUMENTS

| | | | |
|---|---|---|---|
| 7,896,967 B2 | 3/2011 | Hayasaka et al. | 118/715 |
| 2009/0311874 A1 | 12/2009 | Tomita et al. | 438/759 |
| 2010/0075504 A1 | 3/2010 | Tomita et al. | 438/706 |
| 2010/0240219 A1 | 9/2010 | Tomita et al. | 438/706 |
| 2012/0187083 A1* | 7/2012 | Hashizume | 216/37 |

FOREIGN PATENT DOCUMENTS

| | | |
|---|---|---|
| JP | 2010-287655 | 12/2010 |
| KR | 10-2006-0070659 | 6/2006 |
| KR | 10-0781876 | 12/2007 |
| KR | 10-2009-0130828 | 12/2009 |

* cited by examiner

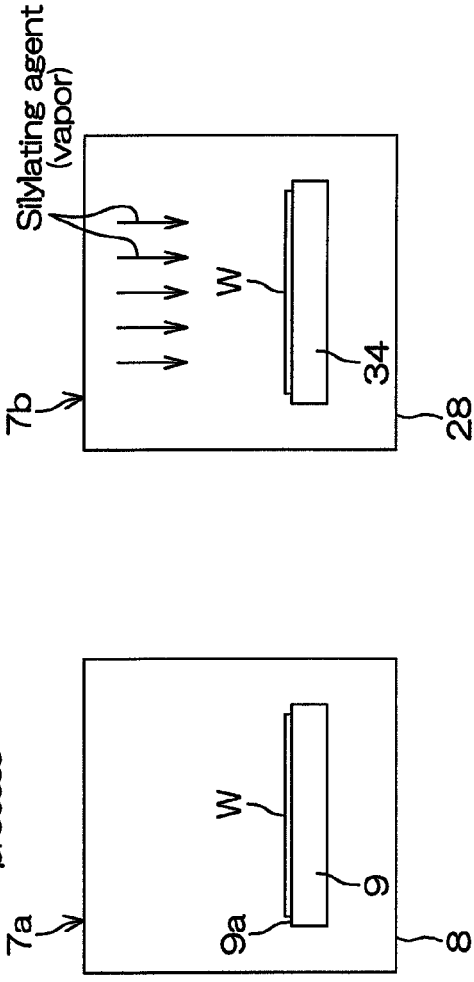
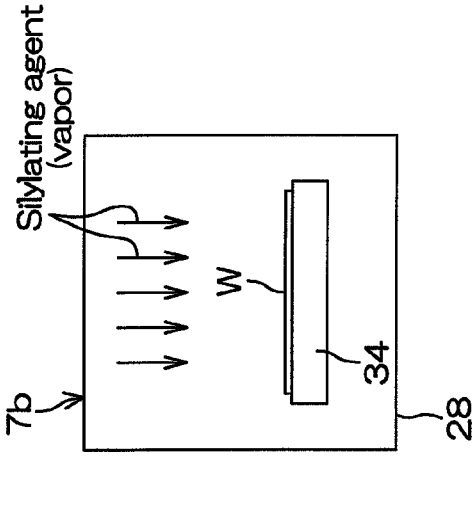
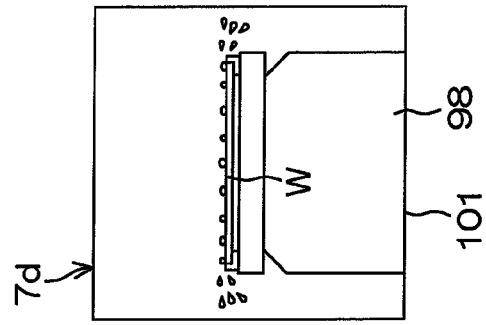
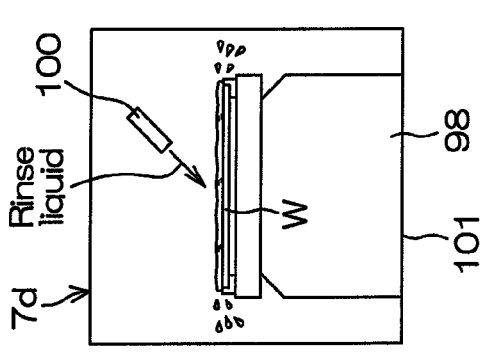
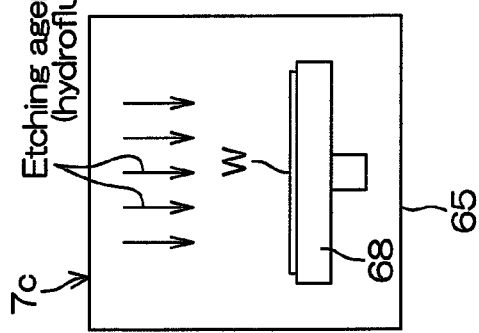

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing a substrate. Examples of substrates to be processed include semiconductor wafers, substrates for liquid crystal displays, substrates for plasma displays, substrates for FEDs (Field Emission Displays), substrates for optical disks, substrates for magnetic disks, substrates for magneto-optical disks, substrates for photomasks, ceramic substrates, and substrates for solar cells.

2. Description of Related Art

In a manufacturing process for a semiconductor device or a liquid crystal display, etc., selective etching for selectively removing a silicon nitride film (SiN film) is performed as necessary by supplying a phosphoric acid aqueous solution of high temperature (for example, 120° C. to 160° C.) as an etching solution to a substrate surface on which the SiN film and a silicon oxide film ($SiO_2$ film) are formed (see, for example, Japanese Unexamined Patent Application Publication No. 2007-258405).

SUMMARY OF THE INVENTION

It is preferable for a selectivity ratio (nitride film removal amount/oxide film removal amount) of the selective etching to be high.

The present invention thus provides a substrate processing method and a substrate processing apparatus by which the selectivity ratio of selective etching can be improved.

A substrate processing method according to the present invention includes a water removing step of removing water from a substrate, a silylating step of supplying a silylating agent to the substrate after the water removing step, and an etching step of supplying an etching agent to the substrate after the silylating step.

With the present method, the substrate is silylated by supplying the silylating agent before the substrate is etched by supplying the etching agent. The silylated substrate is thus etched. As shall be described below, by silylating a substrate on which an oxide film and a nitride film are formed, etching of the oxide film can be suppressed. Thus, by etching the silylated substrate, a selectivity ratio (nitride film removal amount/oxide film removal amount) can be improved.

Further, with the present method, the water removing step of removing water from the substrate is performed before the silylating step. By the water removing step, a protective film that protects the oxide film is formed more readily in the silylating step. A silyl group that the silylating agent has is high in reactivity with a hydroxyl group (OH group) and thus when water is present on the substrate in the silylating step, a reaction of the silylating agent and the OH group in water proceeds with priority and forming of the protective film covering the oxide film of the substrate surface may be inhibited. Thus, in the present invention, the water removing step is performed before the silylating step. The silyl group of the silylating agent is thereby made to react with the oxide film exposed on the substrate and form the protective film that covers the oxide film. By thereafter performing the etching step, the nitride film can be etched with a high selectivity ratio.

In a preferred embodiment of the present invention, the substrate has a surface on which a nitride film and an oxide film are exposed and the etching step is a selective etching step of selectively etching the nitride film by the etching agent.

With this method, reaction of the silylating agent with water adsorbed to the substrate surface can be suppressed because the silylating step is performed after the water removing step, and consequently, a reaction of the oxide film on the substrate surface and the silylating agent occurs efficiently and a protective film that covers the oxide film is formed. By performing etching in this state, selective etching of the nitride film on the substrate can be performed with high selectivity.

Especially, in a case where the oxide film is a hygroscopic oxide film, such as a porous silicon oxide (porous-$SiO_2$) or a low temperature oxide film (LTO), the problem of inhibition of protective film formation due to adsorbed water can be avoided to form a satisfactory protective film by performing the water removing step in advance.

In a preferred embodiment of the present invention, the etching agent is a vapor having an etching component. The etching component may be hydrofluoric acid (HF: hydrogen fluoride).

Gas-phase etching using a vapor having hydrofluoric acid as the etching component (hydrofluoric acid vapor) is strongly influenced by the adsorbed water in the processed substrate. That is, the water in the processed substrate causes the hydrofluoric acid to condense readily, thereby causing excessive etching and lowering of etching selectivity. Especially, when a hygroscopic oxide film is formed on the substrate surface as mentioned above, the hydrofluoric acid condenses readily on the water adsorbed to the oxide film, so that etching of the oxide film progresses and the selectivity ratio of the nitride film etching is reduced. With the present invention, by the performing of the water removing step, the adsorbed water in the processed substrate is eliminated and the protective film that covers the oxide film can be formed by the subsequent silylating step, and the selectivity ratio of the nitride film etching can thus be increased significantly.

The water removing step may include at least one of a heating step of heating the substrate, a pressure reducing step of reducing an atmospheric pressure ambient to the substrate, and an irradiating step of irradiating light onto the substrate. That is, one of the heating step, pressure reducing step, and irradiating step may be performed alone or no less than two of these steps may be combined to remove the water on the substrate.

The substrate processing method may further include a rinsing step of supplying a rinse liquid to the substrate after the etching step has been performed and a drying step of drying the substrate after the rinsing step has been performed.

The substrate processing method may further include a heating step of heating the substrate as a step performed in parallel to the silylating step. In this case, the substrate temperature increases and lowering of a temperature of the silylating agent supplied to the substrate can thus be suppressed. The silylating agent can thus be stabilized in activity even in a case where the activity of the silylating agent changes in accordance with a change of temperature. Further, in a case where a temperature of the substrate is higher than the temperature of the silylating agent supplied to the substrate, the temperature of the silylating agent supplied to the substrate can be raised. Thus, in a case where the activity of the silylating agent increases with a rise in temperature, the activity of the silylating agent can be increased.

A substrate processing apparatus according to the present invention includes a water removing unit that removes water from a substrate, a silylating agent supplying unit that supplies a silylating agent to the substrate, an etching agent supplying unit that supplies an etching agent to the substrate, and a control unit that controls the water removing unit to execute a water removing step of removing water from the substrate, controls the silylating agent supplying unit to execute a silylating step of supplying the silylating agent to the substrate after the water removing step, and controls the etching agent supplying unit to execute an etching step of supplying the etching agent to the substrate after the silylating step.

The water removing unit preferably includes at least one unit among a heating unit that heats the substrate, an irradiating unit that irradiates light onto the substrate, and a pressure reducing unit that reduces an atmospheric pressure ambient to the substrate. That is, the water removing unit may be arranged from one unit alone among the heating unit, the irradiating unit, and the pressure reducing unit or may be arranged as a combination of two or more of the units.

The above and yet other objects, characteristics, and effects of the present invention shall be made clear by the following description of preferred embodiments with reference to the attached drawings.

BRIEF DESCRIPTION OF THE DRAWINGS

FIGS. 6A to 6E are diagrams for describing an example of processing of a substrate performed by the substrate processing apparatus.

DETAILED DESCRIPTION OF THE PREFERRED EMBODIMENTS

Figure 1:
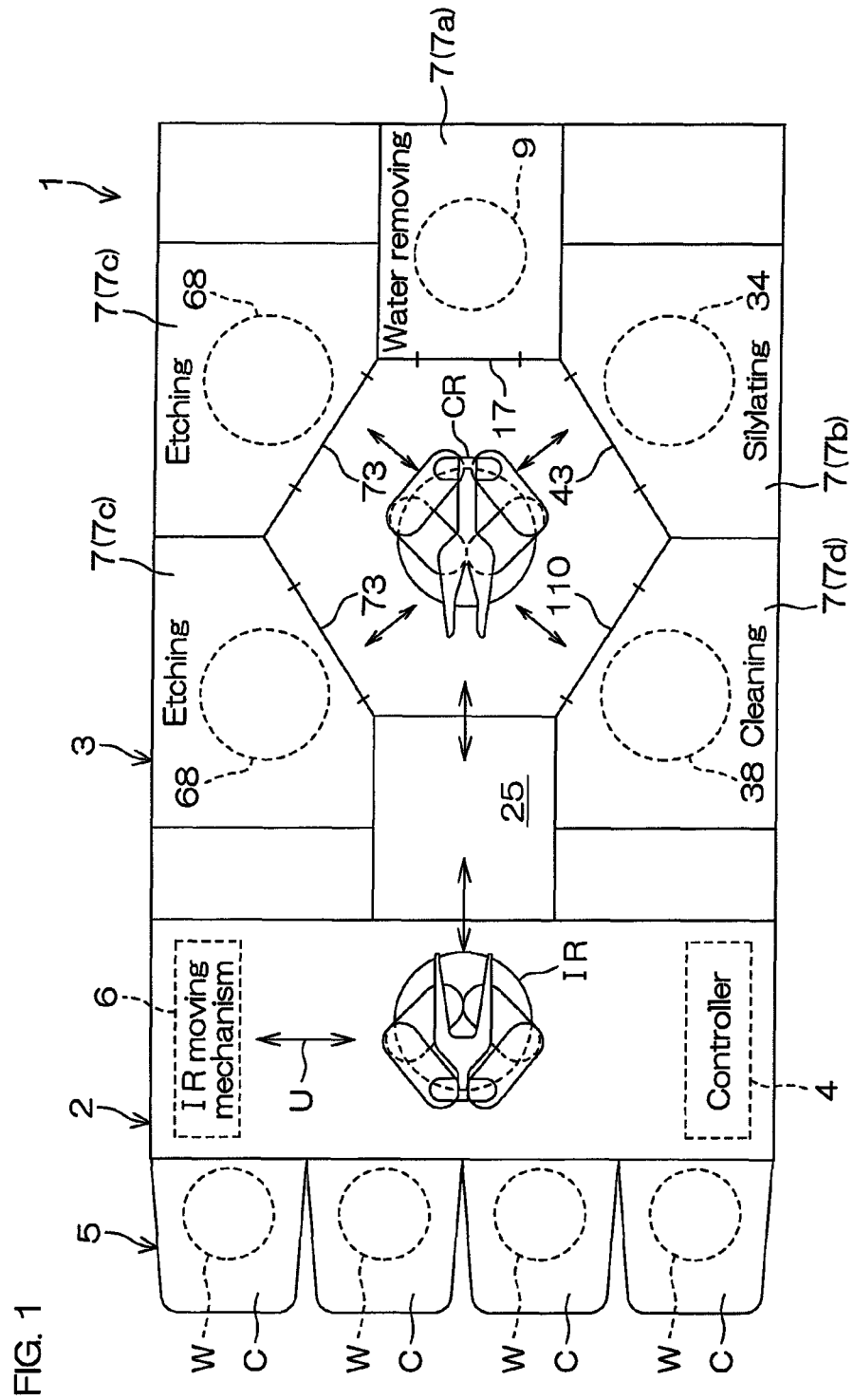
FIG. 1 is a schematic plan view of a layout of a substrate processing apparatus according to a first preferred embodiment of the present invention.

FIG. 1 is a schematic plan view of a layout of a substrate processing apparatus 1 according to a first preferred embodiment of the present invention.

The substrate processing apparatus 1 is a one-by-one type substrate processing apparatus having processing units each of which processes a semiconductor wafer or other circular substrate W one at a time. The substrate processing apparatus 1 includes an indexer block 2, a processing block 3 coupled to the indexer block 2, and a controller 4 controlling operations of apparatuses and opening/closing of valves included in the substrate processing apparatus 1.

The indexer block 2 includes a carrier holding portion 5, an indexer robot IR, and an IR moving mechanism 6. The carrier holding portion 5 holds carriers C each of which is capable of housing a plurality of substrates W. The plurality of carriers C are held by the carrier holding portion 5 in a state of being aligned in a horizontal carrier alignment direction U. The IR moving mechanism 6 moves the indexer robot IR in the carrier alignment direction U. The indexer robot IR performs a carrying-in operation of carrying a substrate W into a carrier C held by the carrier holding portion 5 and a carrying-out operation of carrying the substrate W out from a carrier C.

Meanwhile, the processing block 3 includes a plurality of (for example, no less than four) processing units 7 that process the substrates W and a center robot CR. The plurality of processing units 7 are disposed so as to surround the center robot CR in a plan view. The plurality of processing units 7 include a water removing unit 7a that heats a substrate W to remove water, a silylating unit 7b that silylates the substrate W, etching units 7c that etch the substrate W, and a cleaning unit 7d that cleans the substrate W.

In the present preferred embodiment, a single water removing unit 7a, a single silylating unit 7b, two etching units 7c, and a single cleaning unit 7d are included. One etching unit 7c and the cleaning unit 7d are disposed at two positions at the indexer block 2 side with respect to the center robot CR. A carrying path for carrying the substrate W between the indexer robot IR and the center robot CR is defined between this etching unit 7c and the cleaning unit 7d. The other etching unit 7c and the silylating unit 7b are disposed at two positions at the side opposite to the indexer block 2 side with respect to the center robot CR. The water removing unit 7a is disposed between this etching unit 7c and the silylating unit 7b.

The center robot CR performs a carrying-in operation of carrying a substrate W into each processing unit 7 and a carrying-out operation of carrying the substrate W out from each processing unit 7. Further, the center robot CR carries the substrate W among the plurality of processing units 7. The center robot CR receives a substrate W from the indexer robot IR and delivers the substrate W to the indexer robot IR. The indexer robot IR and the center robot CR are controlled by the controller 4.

Figure 2:
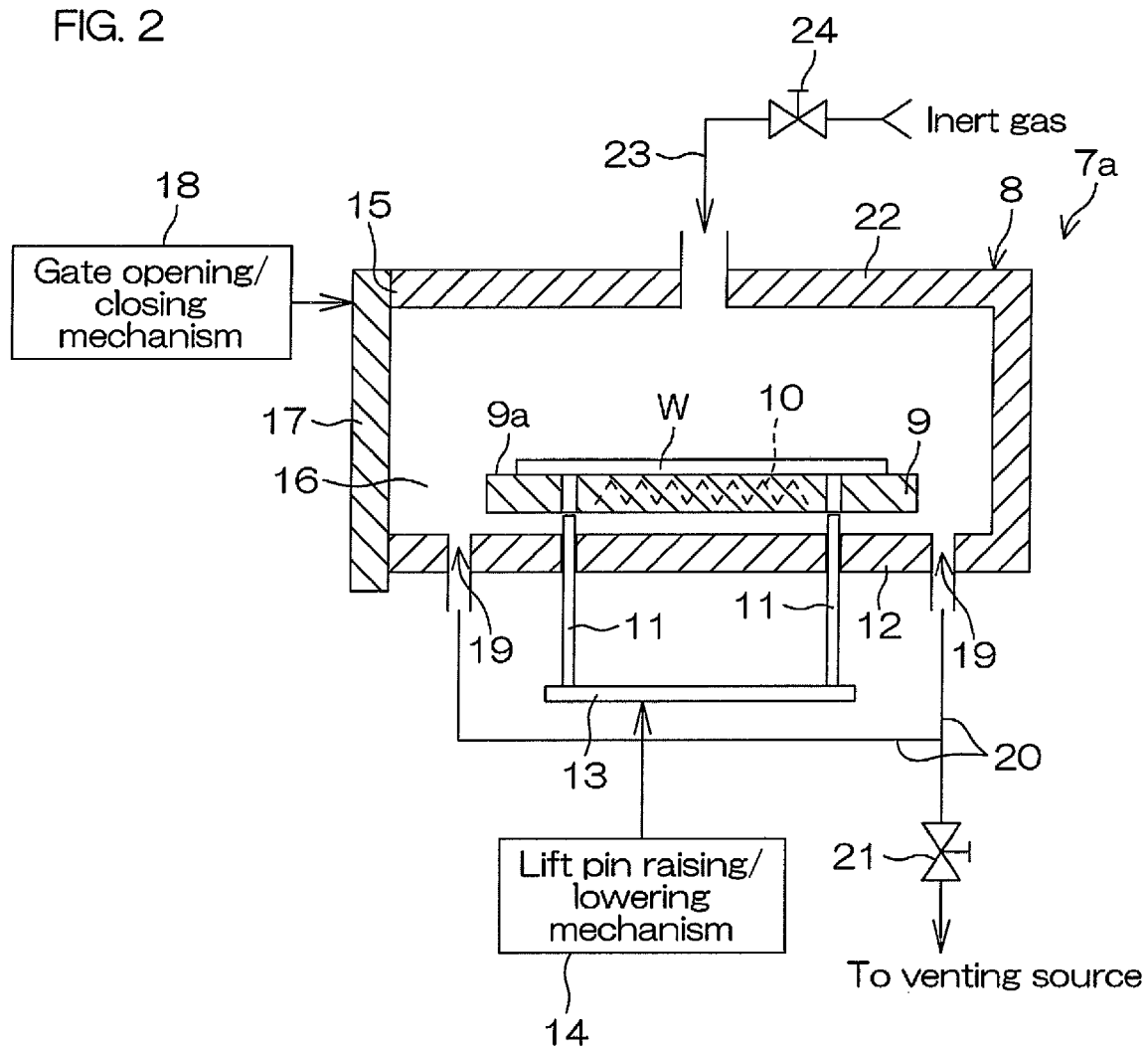
FIG. 2 is a schematic sectional view for describing an arrangement example of a water removing unit.

FIG. 2 is a schematic sectional view for describing an arrangement example of the water removing unit 7a. In the present preferred embodiment, the water removing unit 7a has a basic arrangement of a baking unit that heats the substrate W. The water removing unit 7a includes a hotplate 9 provided inside a chamber 8 of rectangular parallelepiped shape. The hotplate 9 has a substrate placement surface 9a on which the substrate W can be placed. A heater 10 for heating and drying the substrate W is embedded in an interior of the hotplate 9. The substrate W placed on the substrate placement surface 9a can thus be heated by the heat from the heater 10 to remove the water in the substrate surface.

In relation to the hotplate 9, a plurality of (for example, three) lift pins 11 that raise and lower the substrate W with respect to the hotplate 9 are provided. The plurality of lift pins 11 are inserted through a bottom wall 12 of the chamber 8 and are supported by a supporting member 13 in common outside the chamber 8. A lift pin raising/lowering mechanism 14 that includes a cylinder is coupled to the supporting member 13. The lift pin raising/lowering mechanism 14 raises and lowers the plurality of lift pins 11 integrally between positions at which tip ends of the plurality of lift pins 11 project above the hot plate 9 and positions at which the tip ends of the plurality of lift pins 11 are retracted below the hot plate 9.

Also, a gate 16 for carrying in and carrying out the substrate W with respect to the interior of the chamber 8 is formed at one side wall 15 (a side wall at a left side in FIG. 2) of the chamber 8. A gate shutter 17 that opens and closes the gate 16 is provided at an outer side of the side wall 15. A gate opening/closing mechanism 18 that includes a cylinder is coupled to the gate shutter 17. The gate opening/closing mechanism 18 moves the gate shutter 17 between a closed position at which the gate shutter 17 is in close contact with an outer surface of the side wall 15 and seals the gate 16 and an open position at which the gate shutter 17 opens the gate 16 widely by being lowered and laterally spaced from the side wall 15.

Also, vents 19 are formed in a bottom wall 12 of the chamber 8. For example, the plurality of vents 19 are disposed so as to surround the hotplate 9 in a plan view. Base ends of a vent pipe 20, having a tip end connected to a venting source (not shown), are connected to the vents 19. An atmosphere inside the chamber 8 is thereby vented constantly. A vent valve 21 is interposed in a middle of the vent pipe 20. The vent valve 21 is controlled by the controller 4 and opens and closes a flow passage of the vent pipe 20. The venting source may be a venting equipment included in a plant in which the substrate processing apparatus 1 is installed.

An inert gas supply pipe 23 is coupled to a top wall 22 of the chamber 8. The inert gas supply pipe 23 supplies an inert gas (for example, nitrogen gas) from an inert gas supply source into the chamber 8. An inert gas valve 24 is interposed in a middle of the inert gas supply pipe 23. The inert gas valve 24 is controlled by the controller 4 and opens and closes a flow passage of the inert gas supply pipe 23.

An example of processing of the substrate W performed in the water removing unit 7a shall now be described.

While the substrate processing apparatus 1 is in operation, the controller 4 executes control of electricity supply to the heater 10 and controls the hotplate 9 at a predetermined high temperature (temperature higher than room temperature). Further, the controller 4 opens the inert gas valve 24 to introduce the inert gas into a processing space inside the chamber 8 and at the same time opens the vent valve 21 to vent the atmosphere inside the chamber 8.

The center robot CR carries the substrate W into the water removing unit 7a. Before the substrate W is carried into the water removing unit 7a, the gate opening/closing mechanism 18 is driven by the controller 4. The gate shutter 17 is thereby positioned at the open position and the gate 16 is opened. Also, before the substrate W is carried into the water removing unit 7a, the lift pin raising/lowering mechanism 14 is driven by the controller 4. The lift pins 11 are thereby positioned at the positions at which the tip ends thereof project above the substrate placement surface 9a of the hot plate 9. The substrate W is then carried into the chamber 8 by the center robot CR. The substrate W that has been carried into the chamber 8 is placed on the lift pins 11 by the center robot CR. Thereafter, the center robot CR retracts from inside the chamber 8. After the center robot CR has retracted from inside the chamber 8, the gate opening/closing mechanism 18 is driven by the controller 4. The gate shutter 17 is thereby positioned at the closed position and the gate 16 is sealed by the gate shutter 17.

After the gate 16 is sealed, the controller 4 drives the lift pin raising/lowering mechanism 14. The lift pins 11 are thereby lowered to the positions at which the tip ends thereof are retracted below the hotplate 9. By the lowering of the lift pins 11, the substrate W on the lift pins 11 is transferred onto the substrate placement surface 9a of the hot plate 9. The substrate W is thereby heated and the water adsorbed to the substrate W evaporates. The atmosphere containing the evaporated water is discharged from the vents 19 and is replaced by the dry inert gas supplied from the inert gas supply pipe 23. A water removing process of removing the water adsorbed to the substrate W is thus performed.

After elapse of a predetermined time from the placement of the substrate W on the substrate placement surface 9a, the lift pin raising/lowering mechanism 14 is driven by the controller 4. The lift pins 11 are thereby raised and the substrate W is lifted to a position of being upwardly spaced from the substrate placement surface 9a (for example, a position enabling transfer of the substrate W with respect to the center robot CR). The gate opening/closing mechanism 18 is then driven by the controller 4. The gate shutter 17 is thereby positioned at the open position and the gate 16 is opened. In this state, the substrate W supported by the lift pins 11 is carried out from the chamber 8 by the center robot CR.

Figure 3:
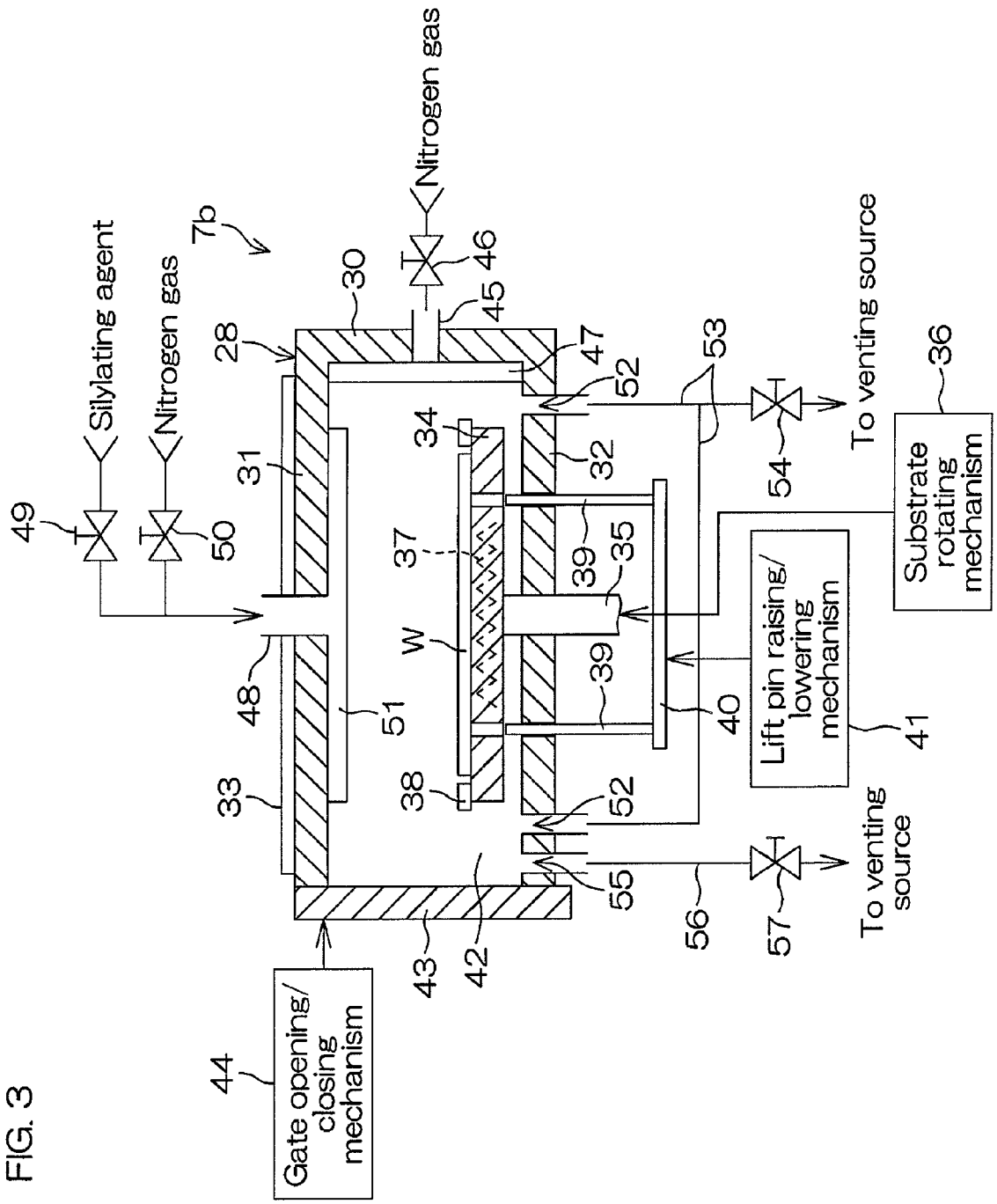
FIG. 3 is a schematic view of an arrangement example of a silylating unit.

FIG. 3 is a schematic view of an arrangement example of the silylating unit 7b. The silylating unit 7b includes a chamber 28. The chamber 28 has, for example, a rectangular parallelepiped shape. The chamber 28 includes a side wall 30 and an upper wall 31 and a bottom wall 32 that face each other vertically. The silylating unit 7b further includes a cooling apparatus 33 disposed along an outer surface (upper surface) of the upper wall 31. The chamber 28 is cooled by the cooling apparatus 33. The cooling apparatus 33 is, for example, a water cooled type cooling apparatus.

The silylating unit 7b further includes a substrate holding base 34 provided inside the chamber 28. A single substrate W that has been carried into the chamber 28 is held by the substrate holding base 34 in a state of being placed on the substrate holding base 34. The substrate holding base 34 is fixed to an upper end of a rotating shaft 35 extending in a vertical direction. The rotating shaft 35 is coupled to a substrate rotating mechanism 36 that rotates the rotating shaft 35 around a central axis of the rotating shaft 35. The substrate rotating mechanism 36 includes, for example, a motor.

A heater 37 for heating the substrate W held by the substrate holding base 34 is embedded in an interior of the substrate holding base 34. Further, a soaking ring 38 for making the substrate W uniform in temperature during heating by the heater 37 is provided on the substrate holding base 34. The soaking ring 38 is formed to a ring shape that surrounds a substrate W holding position on the substrate holding base 34.

In relation to the substrate holding base 34, a plurality of (for example, three) lift pins 39 that raise and lower the substrate W with respect to the substrate holding base 34 are provided. The plurality of lift pins 39 are inserted through a bottom wall 32 of the chamber 28 and are supported by a supporting member 40 in common outside the chamber 28. A lift pin raising/lowering mechanism 41 that includes a cylinder is coupled to the supporting member 40. The lift pin raising/lowering mechanism 41 raises and lowers the plurality of lift pins 39 integrally between positions at which tip ends of the plurality of lift pins 39 project above the substrate holding base 34 and positions at which the tip ends of the plurality of lift pins 39 are retracted below the substrate holding base 34.

Also, a gate 42 for carrying in and carrying out the substrate W with respect to the interior of the chamber 28 is formed at one side wall 29 (a side wall at a left side in FIG. 3) of the chamber 28. A gate shutter 43 that opens and closes the gate 42 is provided at an outer side of the side wall 29. A gate opening/closing mechanism 44 that includes a cylinder is coupled to the gate shutter 43. The gate opening/closing mechanism 44 moves the gate shutter 43 between a closed position at which the gate shutter 43 is in close contact with an outer surface of the side wall 29 and seals the gate 42 and an open position at which the gate shutter 43 opens the gate 42 widely by being lowered and laterally spaced from the side wall 29.

Also, a side introduction pipe 45, which introduces nitrogen gas as an example of an inert gas into the chamber 28, is provided in the other side wall 30 (the side wall at a right side in FIG. 3) of the chamber 28. The nitrogen gas is supplied into the side introduction pipe 45 via a side gas valve 46. The side introduction pipe 45 penetrates through the side wall 30. An end surface of the side introduction pipe 45 that faces the interior of the chamber 28 is substantially flush with an inner surface of the side wall 30. A diffuser plate 47 of a size that covers substantially an entirety of the inner surface of the side wall 30 is provided at the inner surface. The diffuser plate 47 has a plurality of discharge ports (not shown) that face the interior of the chamber 28. The nitrogen gas supplied to the side introduction pipe 45 is dispersingly discharged from the plurality of discharge ports of the diffuser plate 47. The nitrogen gas supplied to the side introduction pipe 45 thus diffuses inside the chamber 28 in a shower-like manner of being substantially uniform in flow velocity within a plane parallel to the inner surface of the side wall 30.

Also, a silylating agent introduction pipe 48 (silylating agent supplying unit) that introduces a vapor of a silylating agent and nitrogen gas into the chamber 28 is provided so as to penetrate through the upper wall 31 of the chamber 28. The silylating agent and the nitrogen gas are supplied to the silylating agent introduction pipe 48 via a silylating agent valve 49 and an upper gas valve 50, respectively. An end surface of the silylating agent introduction pipe 48 that faces the interior of the chamber 28 is substantially flush with an inner surface (lower surface) of the upper wall 31. A disk-shaped diffuser plate 51 having a diameter greater than the substrate W is provided at the inner surface of the upper wall 31. The diffuser plate 51 has a plurality of discharge ports (not shown) that face the interior of the chamber 28. The silylating agent and the nitrogen gas supplied to the silylating agent introduction pipe 48 are dispersingly discharged from the plurality of discharge ports of the diffuser plate 51. The silylating agent and the nitrogen gas supplied to the silylating agent introduction pipe 48 thus diffuse inside the chamber 28 in a shower-like manner of being substantially uniform in flow velocity within a plane parallel to the inner surface of the upper wall 31.

As examples of the silylating agent, TMSI (N-trimethylsilylimidazole), BSTFA (N,O-bis[trimethylsilyl]trifluoroacetamide), BSA (N,O-bis[trimethylsilyl]acetamide), MSTFA (N-methyl-N-trimethylsilyl-trifluoroacetamide), TMSDMA (N-trimethylsilyldimethylamine), TMSDEA (N-trimethylsilyldiethylamine), MTMSA (N,O-bis(trimethylsilyl)trifluoroacetamide), TMCS (with base) (trimethylchlorosilane), and HMDS (hexamethyldisilazane) can be cited. A vapor of at least one of these silylating agents is supplied to the silylating agent introduction pipe 48. The silylating agent vapor supplied to the silylating agent introduction pipe 48 may contain just microparticles of the silylating agent or may contain microparticles of the silylating agent and a carrier gas (for example, an inert gas).

Also, a circumferential vent 52 of annular shape in a plan view that surrounds a circumference of the substrate holding base 34 is formed in a bottom wall 32 of the chamber 28. Base ends of a vent pipe 53, having a tip end connected to a venting source, are connected to the circumferential vent 52. A circumferential vent valve 54 is interposed in a middle portion of the vent pipe 53. When the circumferential vent valve 53 is opened, the atmosphere inside the chamber 28 is vented from the circumferential vent 52, and when the circumferential vent valve 54 is closed, the venting from the circumferential vent 52 is stopped.

Also, at an outer side of the circumferential vent 52, a gate side vent 55 of substantially rectangular shape in a plan view that extends along the side wall 29 is formed in the bottom wall 32 of the chamber 28. A base end of a vent pipe 56, having a tip end connected to a venting source, is connected to the gate side vent 55. A gate side vent valve 57 is interposed in a middle portion of the vent pipe 56. When the gate side vent valve 57 is opened, the atmosphere inside the chamber 28 is vented from the gate side vent 55, and when the gate side vent valve 57 is closed, the venting from the gate side vent 55 is stopped.

An example of processing of the substrate W performed in the silylating unit 7b shall now be described.

The center robot CR carries the substrate W into the silylating unit 7b. Before the substrate W is carried into the silylating unit 7b, the gate opening/closing mechanism 44 is driven by the controller 4. The gate shutter 43 is thereby positioned at the open position and the gate 42 is opened. While the gate 42 is opened, the side gas valve 46 is opened by the controller 4 and nitrogen gas is introduced into the chamber 28 from the side introduction pipe 45. Further, the gate side vent valve 57 is opened by the controller 4 and the atmosphere inside the chamber 28 is vented from the gate side vent 55. A gas flow of nitrogen gas directed from the side opposite to the gate 42 of the substrate holding base 34, that is, from the side wall 30 side to the gate 42 is formed inside the chamber 28, and inflow of an atmosphere at an exterior of the chamber 28 into the chamber 28 is prevented by the gas flow. While the gate 42 is opened, the silylating agent valve 49, upper gas valve 50, and the circumferential vent valve 54 are closed.

Also, before the substrate W is carried into the silylating unit 7b, the lift pin raising/lowering mechanism 41 is driven by the controller 4. The lift pins 39 are thereby positioned at the positions at which the tip ends thereof project above the substrate holding base 34. The substrate W is then carried into the chamber 28 by the center robot CR. The substrate W that has been carried into the chamber 28 is placed on the lift pins 39 by the center robot CR. Thereafter, the center robot CR retracts from inside the chamber 28. After the center robot CR has retracted from inside the chamber 28, the gate opening/closing mechanism 44 is driven by the controller 4. The gate shutter 43 is thereby positioned at the closed position and the gate 42 is sealed by the gate shutter 43.

After the gate 42 is sealed, the controller 4 closes the side gas valve 46 and the gate side vent valve 57 and opens the upper gas valve 50 and the circumferential vent valve 54. Nitrogen gas is thereby introduced into the chamber 28 from the silylating agent introduction pipe 48 and at the same time, the atmosphere inside the chamber 28 is rapidly vented from the circumferential vent 52. Consequently, the atmosphere inside the chamber 28 is replaced in a short time by the nitrogen gas introduced from the silylating agent introduction pipe 48. Also, in parallel to the replacement of the atmosphere inside the chamber 28 by the nitrogen gas atmosphere, the lift pin raising/lowering mechanism 41 is driven by the controller 4. The lift pins 39 are thereby lowered to the positions at which the tip ends thereof are retracted below the substrate holding base 34. By the lowering of the lift pins 39, the substrate W on the lift pins 39 is transferred onto the substrate holding base 34. The substrate W is thereby held by the substrate holding base 34.

After the substrate W has been transferred onto the substrate holding base 34, the controller 4 closes the upper gas valve 50 and opens the silylating agent valve 49. The silylating agent vapor is thereby introduced from the silylating agent introduction pipe 48 into the chamber 28 and the silylating agent vapor is supplied to an upper surface of the substrate W. In parallel to the supplying of the silylating agent, the substrate rotating mechanism 36 is driven by the controller 4 and the substrate W is thereby rotated. The silylating agent is thereby supplied uniformly onto an entirety of the upper surface of the substrate W. Further, in parallel to the supplying of the silylating agent, the heater 37 is driven by the controller 4 and the substrate W is heated to a temperature higher than an ordinary temperature (same as the room temperature, for example, 20° C. to 30° C.). The substrate W held by the substrate holding base 34 is silylated by the supplying of the silylating agent.

After the supplying of the silylating agent has been performed for a predetermined time, the lift pin raising/lowering mechanism 41 is driven by the controller 4. The lift pins 39 are thereby raised and the substrate W is lifted to a position of being upwardly spaced from the substrate holding base 34 (for example, a position enabling transfer of the substrate W with respect to the center robot CR). The controller 4 then closes the silylating agent valve 49 and opens the upper gas valve 50. Nitrogen gas of the ordinary temperature is thereby introduced from the silylating agent introduction pipe 48 into the chamber 28 and the nitrogen gas is supplied to the upper surface of the substrate W. Consequently, the substrate W of high temperature is cooled by the nitrogen gas of the ordinary temperature. While the substrate W is being cooled by the nitrogen gas, the circumferential vent valve 54 is kept open. The atmosphere inside the chamber 28 is thus rapidly replaced by the nitrogen gas introduced from the silylating agent introduction pipe 48.

After the atmosphere inside the chamber 28 has been replaced by the nitrogen gas atmosphere, the gate opening/closing mechanism 44 is driven by the controller 4. The gate shutter 43 is thereby positioned at the open position and the gate 42 is opened. Also, when the gate 42 is opened, the controller 4 closes the upper gas valve 50 and the circumferential vent valve 54 and opens the side gas valve 46 and the gate side vent valve 57. A gas flow of nitrogen gas directed from the side wall 30 side to the gate 42 is thereby formed inside the chamber 28, and inflow of the atmosphere at the exterior of the chamber 28 into the chamber 28 is prevented by the gas flow. In this state, the substrate W supported by the lift pins 39 is carried out from the chamber 28 by the center robot CR.

Figure 4:
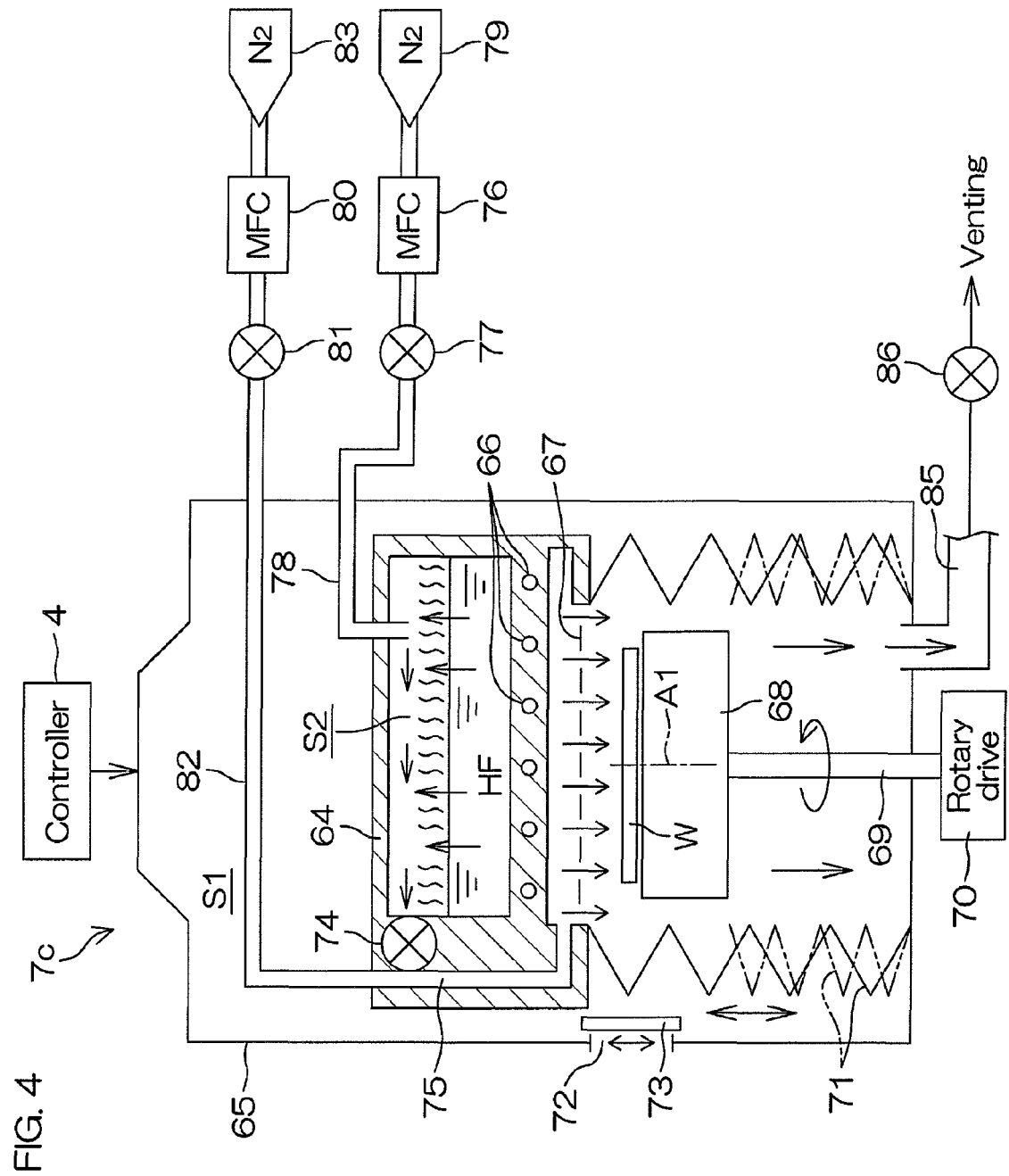
FIG. 4 is a schematic sectional view for describing an arrangement example of an etching unit.

FIG. 4 is a schematic sectional view for describing an arrangement example of the etching unit 7c. In the present preferred embodiment, the etching unit 7c is a vapor processing unit, that is, a gas phase etching unit that supplies a vapor containing hydrofluoric acid (hydrogen fluoride) as an example of an etching agent to the substrate W. The etching unit 7c includes an HF vapor generating container 64 that stores hydrofluoric acid (liquid) and a chamber 65 (processing chamber) internally provided with a sealed space S1 that houses the HF vapor generating container 64. A concentration of the hydrofluoric acid inside the HF vapor generating container 64 is adjusted to a concentration of a so-called pseudo-azeotropic composition (for example, approximately 39.6% under 1 atmosphere and room temperature). The hydrofluoric acid inside the HF vapor generating container 64 is heated by an HF heater 66 built into the HF vapor generating container 64. The temperature of the hydrofluoric acid inside the HF vapor generating container 64 is controlled by the controller 4.

The etching unit 7c includes a punching plate 67 disposed below the HF vapor generating container 64 and a hotplate 68 disposed below the punching plate 67. The hotplate 68 is an example of a substrate holding unit that holds the substrate W and is also an example of a substrate heater that heats the substrate W. The hotplate 68 holds the substrate W horizontally at a substrate holding position (position shown in FIG. 4) at which the upper surface of the substrate W faces the punching plate 67. The substrate W is supported while being heated by the hot plate 68. The temperature of the substrate W is maintained at a fixed temperature within a predetermined range (for example, 30 to 100° C.) by the controller 4. The hotplate 68 is connected to an upper end portion of a rotating shaft 69. A rotary drive mechanism 70 that includes a motor, etc., is connected to the rotating shaft 69. When the rotary drive mechanism 70 rotates the rotating shaft 69, the hotplate 68 rotates around a vertical axis together with the rotating shaft 69. The substrate W held by the hotplate 68 is thereby rotated around a vertical rotation axis A1 passing through a center of the substrate W.

The etching unit 7c further includes cylindrical bellows 71 disposed at a circumference of the hotplate 68, an expansion/contraction unit (not shown) that vertically expands and contracts the bellows 71, a shutter 73 that opens and closes an opening 72 formed in a side wall of the chamber 65, and an opening/closing unit (not shown) that moves the shutter 73. The hotplate 68 is disposed at an inner side of the bellows 71. The opening 72 is disposed at a side of the hotplate 68. The expansion/contraction unit expands and contracts the bellows 71 between a sealing position (position indicated by solid lines) at which an upper end edge of the bellows 71 contacts the punching plate 67 and a space peripheral to the hotplate 68 is sealed and a retracted position (position indicated by alternate long and two short dashes lines) at which the upper end edge of the bellows 71 is retracted below an upper surface of the hotplate 68. Also, the opening/closing unit moves the shutter 73 between an open position at which the opening 72 is opened and a closed position (position shown in FIG. 4) at which the opening 72 is closed.

The HF vapor generating container 64 includes a vapor generating space S2 that is filled with the hydrofluoric acid vapor (gas resulting from evaporation of the hydrofluoric acid) and a flow passage 75 connected to the vapor generating space S2 via a communication valve 74. The HF vapor generating container 64 is connected to a first piping 78 having a first flow controller (MFC) 76 and a first valve 77 interposed therein. The HF vapor generating container 64 is connected to a first nitrogen gas supply source 79 via the first piping 78. Nitrogen gas, which is an example of an inert gas, is supplied to the vapor generating space S2 via the first piping 78. In the same manner, the flow passage 75 is connected to a second piping 82 having a second flow controller (MFC) 80 and a second valve 81 interposed therein. The flow passage 75 is connected to a second nitrogen gas supply source 83 via the second piping 82. Nitrogen gas is supplied to the flow passage 75 via the second piping 82.

The communication valve 74, the first valve 77, and the second valve 81 are opened and closed by the controller 4. In a state where the communication valve 74 and the first valve 77 are open, the hydrofluoric acid vapor adrift in the vapor generating space S2 is supplied via the communication valve 74 to the flow passage 75 by the flow of nitrogen gas from the first nitrogen gas supply source 79. Thus, in a state where all of the valves 74, 77, and 81 are open, the HF vapor (gas containing the hydrofluoric acid vapor and nitrogen gas) supplied to the flow passage 75 is guided to the punching plate 67 by the flow of nitrogen gas from the second nitrogen gas supply source 83. The HF vapor is thereby made to pass through a plurality of penetrating holes formed in the punching plate 67 and is blown onto the upper surface of the substrate W held by the hotplate 68. Also, in a state where only the second valve 81 is open, only the nitrogen gas is guided to the punching plate 67. The nitrogen gas is thereby blown onto the upper surface of the substrate W.

The etching unit 7c further includes a vent pipe 85 that discharges the gas inside the chamber 65 and a vent valve 86 interposed in the vent pipe 85. The vent valve 86 is connected to a venting source, such as a venting utility of a plant. The vent valve 86 is controlled to open and close by the controller 4.

An example of processing of the substrate W performed by the etching unit 7c shall now be described. Specifically, a process of supplying a hydrogen-fluoride-containing vapor to a surface of a silicon substrate, on which a thin film of LP-SiN (low pressure-silicon nitride) that is an example of a nitride film is formed, to etch the thin film of LP-SiN shall be described.

When the substrate W is to be processed by the etching unit 7c, a carrying-in step of carrying the substrate W into the chamber 65 is performed. Specifically, in a state where the bellows 71 are positioned at the retracted position and the shutter 73 is positioned at the open position, the controller 4 makes the center robot CR carry the substrate W into the chamber 65. Then, after making a hand of the center robot CR retract from inside the chamber 65, the controller 4 makes the bellows 71 move to the sealing position and makes the shutter 73 move to the closed position.

A preprocessing step of replacing the atmosphere inside the chamber 65 with nitrogen gas is then performed. Specifically, the controller 4 rotates, by means of the rotary drive mechanism 70, the substrate W held by the hotplate 68. Thereafter, in the state where the bellows 71 are positioned at the sealing position, the controller 4 opens the vent valve 86 and the second valve 81. By the second valve 81 being opened, nitrogen gas is supplied from the second piping 82 to the flow passage 75 and the nitrogen gas is supplied from the punching plate 67 into the bellows 71. The atmosphere inside the chamber 65 is replaced by the nitrogen gas and a water amount and an oxygen concentration inside the chamber 65 are reduced.

Thereafter, an etching step of supplying the HF vapor to the substrate W is performed. Specifically, the controller 4 opens the communication valve 74, the first valve 77, and the second valve 81. The HF vapor is thereby made to pass through the penetrating holes of the punching plate 67 and is blown onto the substrate W in the rotating state that is maintained at the fixed temperature by the hotplate 68. The HF vapor is thereby supplied to the substrate W and the nitrogen gas inside the bellows 71 is replaced by the HF vapor. After elapse of a predetermined time from the opening of the communication valve 74, the first valve 77, and the second valve 81, the controller 4 closes the communication valve 74, the first valve 77, and the second valve 81 to stop the supplying of the HF vapor to the substrate W.

Thereafter, a postprocessing step of replacing the atmosphere inside the chamber 65 by nitrogen gas is performed. Specifically, the controller 4 opens the second valve 81. The atmosphere inside the bellows 71 that contains the HF vapor is thereby pushed out into the vent pipe 85 by the nitrogen gas supplied into the bellows 71. The atmosphere inside the bellows 71 is thus replaced by nitrogen gas. After the atmosphere inside the bellows 71 is replaced by nitrogen gas, the controller 4 closes the second valve 81. Thereafter, the controller 4 stops the rotation of the substrate W.

Thereafter, a carrying-out step of carrying out the substrate W from inside the chamber 65 is performed. Specifically, the controller 4 moves the bellows 71 from the sealing position to the retracted position and moves the shutter 73 from closed position to the open position. Then, in the state where the bellows 71 and the shutter 73 are positioned at the retracted position and the open position, respectively, the controller 4 makes the center robot CR carry out the substrate W from inside the chamber 65. Thereafter, the controller 4 moves the shutter 73 to the closed position.

In the etching step, the HF vapor that has passed through the punching plate 67 is supplied uniformly to the entirety of the upper surface of the substrate W. The HF vapor thus condenses on the substrate W and a condensed phase that contains hydrogen fluoride and water is formed uniformly on the entire upper surface of the substrate W. A liquid film of extremely thin thickness is thus formed on the substrate W and the entire upper surface of the substrate W is covered by the liquid film. The hydrogen fluoride and water are thus supplied uniformly to the entire upper surface of the substrate W and the nitride film that is exposed on the substrate W is etched uniformly.

Figure 5:
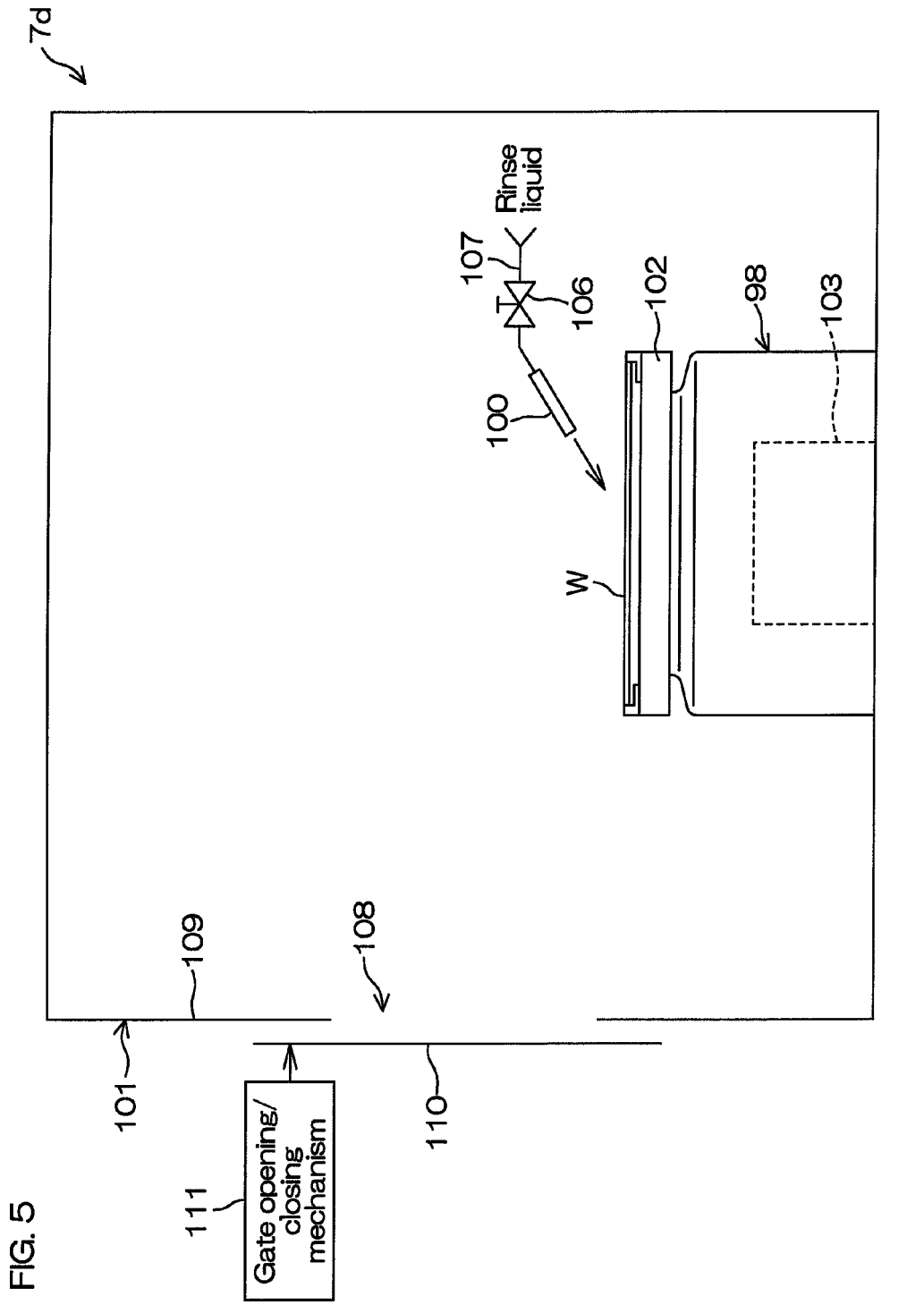
FIG. 5 is a schematic sectional view for describing an arrangement example of a cleaning unit.

FIG. 5 is a schematic sectional view for describing an arrangement example of the cleaning unit 7d. The cleaning unit 7d includes a spin chuck 98 horizontally holding and rotating the substrate W, a rinse liquid nozzle 100 supplying a rinse liquid onto the upper surface of the substrate W held by the spin chuck 98, and a chamber 101 housing the spin chuck 98 and the rinse liquid nozzle 100.

The spin chuck 98 includes a disk-shaped spin base 102 that holds the substrate W horizontally and is rotatable around a vertical axis passing through the center of the substrate W and a spin motor 103 that rotates the spin base 102 around the vertical axis. The spin chuck 98 may be a clamping type chuck that holds the substrate W horizontally by clamping the substrate W in a horizontal direction or may be a vacuum type chuck that holds the substrate W horizontally by suctioning of a rear surface (lower surface) of the substrate W that is a non-device-forming surface. In the example of FIG. 5, the spin chuck 98 is a clamping type chuck. The spin chuck 98 holds the substrate W horizontally.

The rinse liquid nozzle 100 is connected to a rinse liquid supply pipe 107 having a rinse liquid valve 106 interposed therein. The supplying of the rinse liquid to the rinse liquid nozzle 100 is controlled by opening and closing of the rinse liquid valve 106. The rinse liquid valve 106 is controlled by the controller 4. The rinse liquid supplied to the rinse liquid nozzle 100 is discharged toward a central portion of the upper surface of the substrate W held by the spin chuck 98. As examples of the rinse liquid supplied to the rinse liquid nozzle 100, pure water (deionized water), carbonated water, electrolyzed ion water, hydrogen water, ozone water, aqueous hydrochloric acid of dilute concentration (for example, approximately 10 to 100 ppm), etc., can be cited.

The chamber 101 includes a partition wall 109 having formed therein an opening 108 for carrying in and carrying out the substrate W with respect to the interior of the chamber 101 and a gate shutter 110 covering the opening 108. The gate shutter 110 is disposed outside the partition wall 109. A gate opening/closing mechanism 111 that includes a cylinder is coupled to the gate shutter 110. The gate opening/closing mechanism 111 moves the gate shutter 110 between a closed position at which the gate shutter 110 is put in close contact with an outer surface of the partition wall 109 and seals the opening 108 and an open position at which the gate shutter 110 opens the opening 108 widely by being lowered and laterally spaced from the partition wall 109.

An example of processing of the substrate W performed in the cleaning unit 7d shall now be described.

The center robot CR carries the substrate W into the cleaning unit 7d. Before the substrate W is carried into the cleaning unit 7d, the gate opening/closing mechanism 111 is driven by the controller 4. The gate shutter 110 is thereby positioned at the open position and the opening 108 of the chamber 101 is opened. Thereafter, the center robot CR carries the substrate W into the chamber 28 and places the substrate W on the spin chuck 98. After making the center robot CR place the substrate W on the spin chuck 98, the controller 4 makes the center robot CR retract from inside the chamber 101. Thereafter, the gate opening/closing mechanism 111 is driven by the controller 4 and the gate shutter 110 is thereby positioned at the closed position. The opening 108 of the chamber 101 is thereby sealed by the gate shutter 110. After the opening 108 of the chamber 101 is sealed, the controller 4 controls the spin motor 103 to rotate the substrate W held by the spin chuck 98.

Thereafter, a rinse process of supplying the rinse liquid to the substrate W to wash off a chemical solution component (mainly an etching agent component that became attached in the etching unit 7c) attached to the substrate W is performed. Specifically, while rotating the substrate W by the spin chuck 98, the controller 4 opens the rinse liquid valve 106 to make the rinse liquid be discharged from the rinse liquid nozzle 100 toward the central portion of the upper surface of the substrate W held by the spin chuck 98. The rinse liquid discharged from the rinse liquid nozzle 100 is supplied to the central portion of the upper surface of the substrate W and spreads outward along the upper surface of the substrate W upon receiving a centrifugal force due to rotation of the substrate W. The rinse liquid is thereby supplied to the entire upper surface of the substrate W and the etching liquid attached to the substrate W is washed off. When a predetermined time elapses from the opening of the rinse liquid valve 106, the controller 4 closes the rinse liquid valve 106 and stops the discharge of the rinse liquid from the rinse liquid nozzle 100.

Thereafter, a drying process (spin drying) of drying the substrate W is performed. Specifically, the controller 4 controls the spin motor 103 to rotate the substrate W at a high rotation speed (for example, several thousand rpm). A large centrifugal force is thereby made to act on the rinse liquid attached to the substrate W and the rinse liquid is spun off to a periphery of the substrate W. The rinse liquid is thereby removed from the substrate W and the substrate W dries. After the drying process has been performed for a predetermined time, the controller 4 controls the spin motor 103 to stop the rotation of the substrate W by the spin chuck 98. Thereafter, the gate opening/closing mechanism 111 is driven by the controller 4 and the gate shutter 110 is positioned at the open position. The opening 108 of the chamber 101 is thereby opened. Thereafter, the substrate W held by the spin chuck 98 is carried out from inside the chamber 101 by the center robot CR.

FIGS. 6A to 6E are diagrams for describing an example of processing of the substrate W performed by the substrate processing apparatus 1. In the following, an example of selective etching shall be described where an etching solution is supplied to a surface of a substrate W on which an SiN film, which is an example of a nitride film, and an $SiO_2$ film, which is an example of an oxide film, are formed and the SiN film is thereby selectively removed. The oxide film formed on the surface of the substrate W may be a film (TEOS film) formed using TEOS (tetraethyl orthosilicate). The present preferred embodiment is especially effective in a case of performing selective etching on a substrate on which hygroscopic oxide film, such as a porous oxide film, and a nitride film are exposed. FIG. 1 and FIGS. 6A to 6E shall be referred to in the following description.

An unprocessed substrate W housed inside a carrier C held by the carrier holding portion 5 is carried out by the indexer robot IR. The substrate W carried out from inside the carrier C is transferred from the indexer robot IR to the center robot CR. The center robot CR carries the unprocessed substrate W, received from the indexer robot IR, into the water removing unit 7a.

As shown in FIG. 6A, at the water removing unit 7a, the substrate W is placed on the substrate placement surface 9a of the hotplate 9 and the substrate W is thereby heated and a prebaking process is performed. By the prebaking process, the water adsorbed to the substrate W evaporates and is discharged out of the substrate W. More specifically, the water adsorbed to the oxide film on the surface of the substrate W evaporates in particular and is discharged. Thus, even if the oxide film formed on the surface of the substrate W is a hygroscopic oxide film, such as a porous oxide film or an LTO film, the water adsorbed inside the oxide film can be removed. When the prebaking process of removing the adsorbed water from the substrate W ends, the substrate W is carried out from the water removing unit 7a by the center robot CR. The substrate W carried out from the water removing unit 7a is carried into the silylating unit 7b by the center robot CR.

As shown in FIG. 6B, at the silylating unit 7b, the silylating agent vapor is supplied to the substrate W to silylate the substrate W (silylating process). Specifically, a vapor of HMDS, which is an example of a silylating agent, is supplied to the surface of the substrate W held by the substrate holding base 34 and the surface of the substrate W is silylated. A protective film is thereby formed on the surface of the oxide film exposed on the substrate W. After the surface of the substrate W has been silylated, the substrate W is carried out from the silylating unit 7b by the center robot CR. The substrate W carried out from the silylating unit 7b is carried into the etching unit 7c by the center robot CR.

As shown in FIG. 6C, at the etching unit 7c, the hydrofluoric acid vapor is supplied to the substrate W to selectively etch the nitride film exposed on the substrate W. In this process, the oxide film exposed on the substrate W is hardly lost because the oxide film is covered by the protective film formed by silylation. When the selective etching of the nitride film on the substrate W ends, the substrate W is carried out from the etching unit 7c by the center robot CR. The substrate W carried out from the etching unit 7c is carried into the cleaning unit 7d by the center robot CR.

As shown in FIG. 6D, at the cleaning unit 7d, the rinse liquid (for example, pure water) is supplied to the surface of the substrate W held by the spin chuck 98 and the chemical solution (especially the etching agent) attached to the surface of the substrate W is washed off (rinsing process). After the rinsing process, the rinse liquid attached to the substrate W is removed from the substrate W by high speed rotation of the substrate W as shown in FIG. 6E. The substrate W held by the spin chuck 98 is thereby dried (drying process).

The substrate W on which the drying process has been performed in the cleaning unit 7d is carried out from the cleaning unit 7d by the center robot CR. The center robot CR then delivers the substrate W to the indexer robot IR. The indexer robot IR carries the processed substrate W, received from the center robot CR, into a carrier C held by the carrier holding portion 5. The series of processes at the substrate processing apparatus 1 is thereby ended. The controller 4 executes such operations repeatedly to process a plurality of substrates W one by one in each of the processing units.

Figure 7:
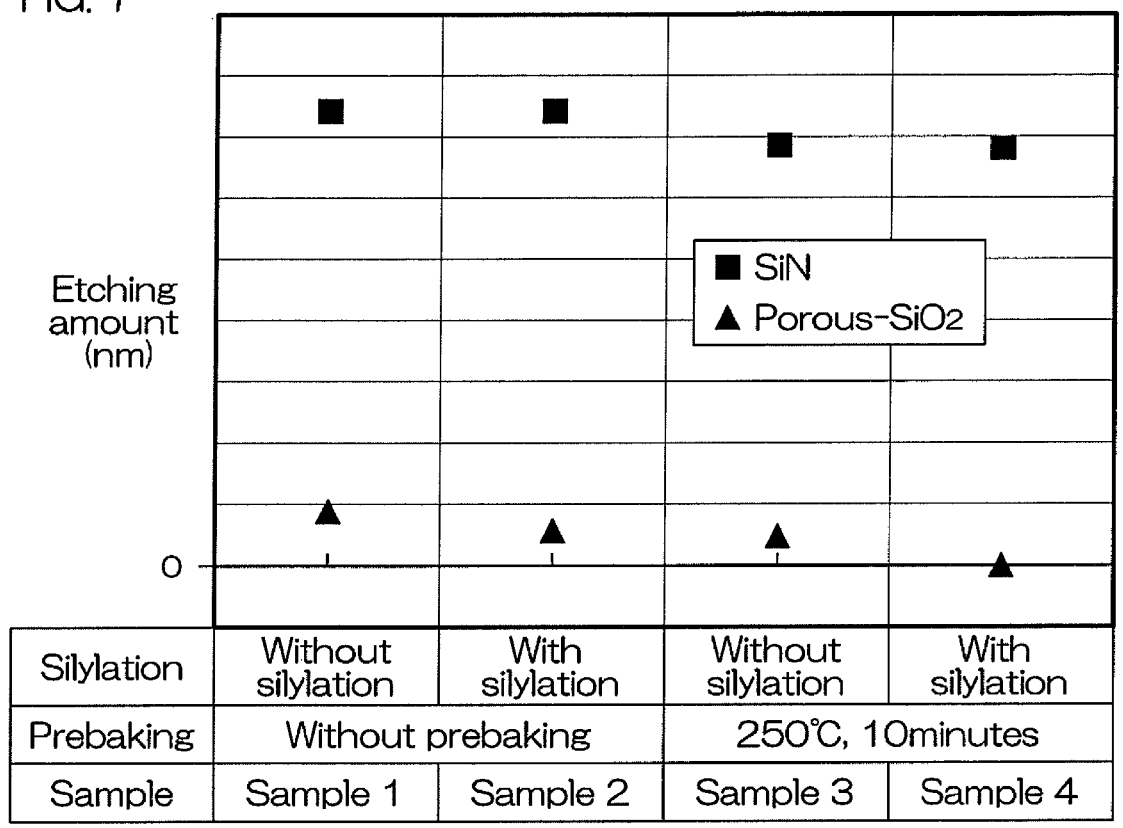
FIG. 7 shows experimental results related to selective etching of a nitride film by a hydrofluoric acid vapor.

FIG. 7 shows experimental results related to selective etching of a nitride film by a hydrofluoric acid vapor. Sample 1, Sample 2, and Sample 3 are comparative examples and Sample 4 is an inventive example. All samples are samples on which a nitride film (SiN) and a porous silicon oxide film (porous $SiO_2$) are formed and exposed on a silicon substrate. Sample 1 is an example where etching by the hydrofluoric acid vapor was performed without performing either of the water removing process (prebaking process) and the silylating process. Sample 2 is an example where etching by the hydrofluoric acid vapor was performed after performing the silylating process without performing the water removing process (prebaking process). Sample 3 is an example where the water removing process (prebaking process: 250° C., 10 minutes) was performed and the etching by the hydrofluoric acid vapor was thereafter performed without performing the silylating process. Sample 4 is an example where the water removing process (prebaking process: 250° C., 10 minutes) was performed, the silylating process was performed next, and the etching by the hydrofluoric acid vapor was performed thereafter.

From a comparison of Samples 1 and 2, it can be understood that an etching amount of the porous silicon oxide film is reduced by the silylating process. Further, from a comparison of Samples 1, 2, and 3, it can be understood that the etching amount of the porous oxide film can be reduced by the same amount as the silylating process by the water removing process. From a comparison of Samples 1, 2, 3, and 4, it can be under-stood that by performing the water removing process before the silylating process, the etching amount of the porous silicon oxide film can be made substantially zero and the nitride film etching selectivity ratio can thus be made practically infinite. That is, by the water removing process preceding the silylating process, the effect of protective film formation by silylation can be increased significantly and the nitride film etching selectivity ratio can thereby be improved significantly.

As described above, with the first preferred embodiment, after performing the water removing process on the substrate W, the silylating agent is supplied to the substrate W and thereafter the etching agent (the hydrofluoric acid vapor in the present preferred embodiment) is supplied to the substrate W. The protective film can thereby be formed reliably by silylation on the surface of the oxide film formed on the substrate W, and the nitride film formed on the substrate W can be etched at a high selectivity ratio by the etching that is performed thereafter.

Figure 8:
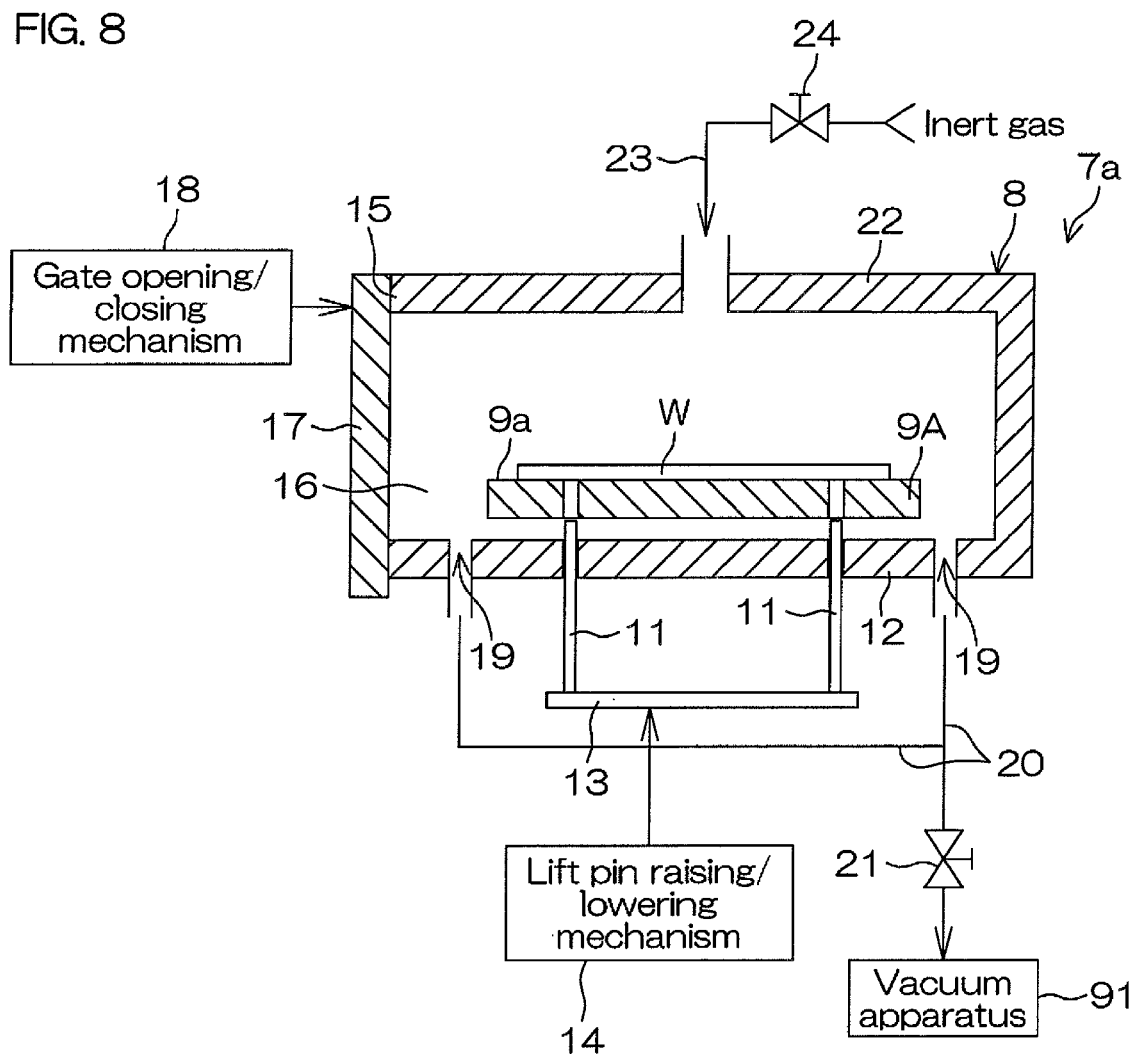
FIG. 8 shows another arrangement example of a water removing unit.

FIG. 8 shows another arrangement example of the water removing unit 7a. In FIG. 8, portions corresponding to respective portions shown in FIG. 2 described above are provided with the same reference symbols. With the present arrangement example, a substrate holding base 9A is included in place of the hotplate 9. That is, the substrate holding base 9A has a function of holding the substrate W but does not have a function of heating the substrate W. The water removing unit 7a functions as a reduced pressure drying unit. Specifically, after the substrate W is held on the substrate holding base 9A and the gate 16 is closed by the gate shutter 17, the interior of the chamber 8 is put in the sealed state. Then, after the atmosphere inside the chamber 8 is replaced by the inert gas, the inert gas valve 24 is closed, and the atmosphere inside the chamber 8 is suctioned from the vent 19 and via the vent pipe 20 by a vacuum apparatus 91. The interior of the chamber 8 is thereby depressurized and the water adsorbed to the substrate W (especially the water adsorbed to the oxide film formed on the substrate W) is removed.

Figure 9:
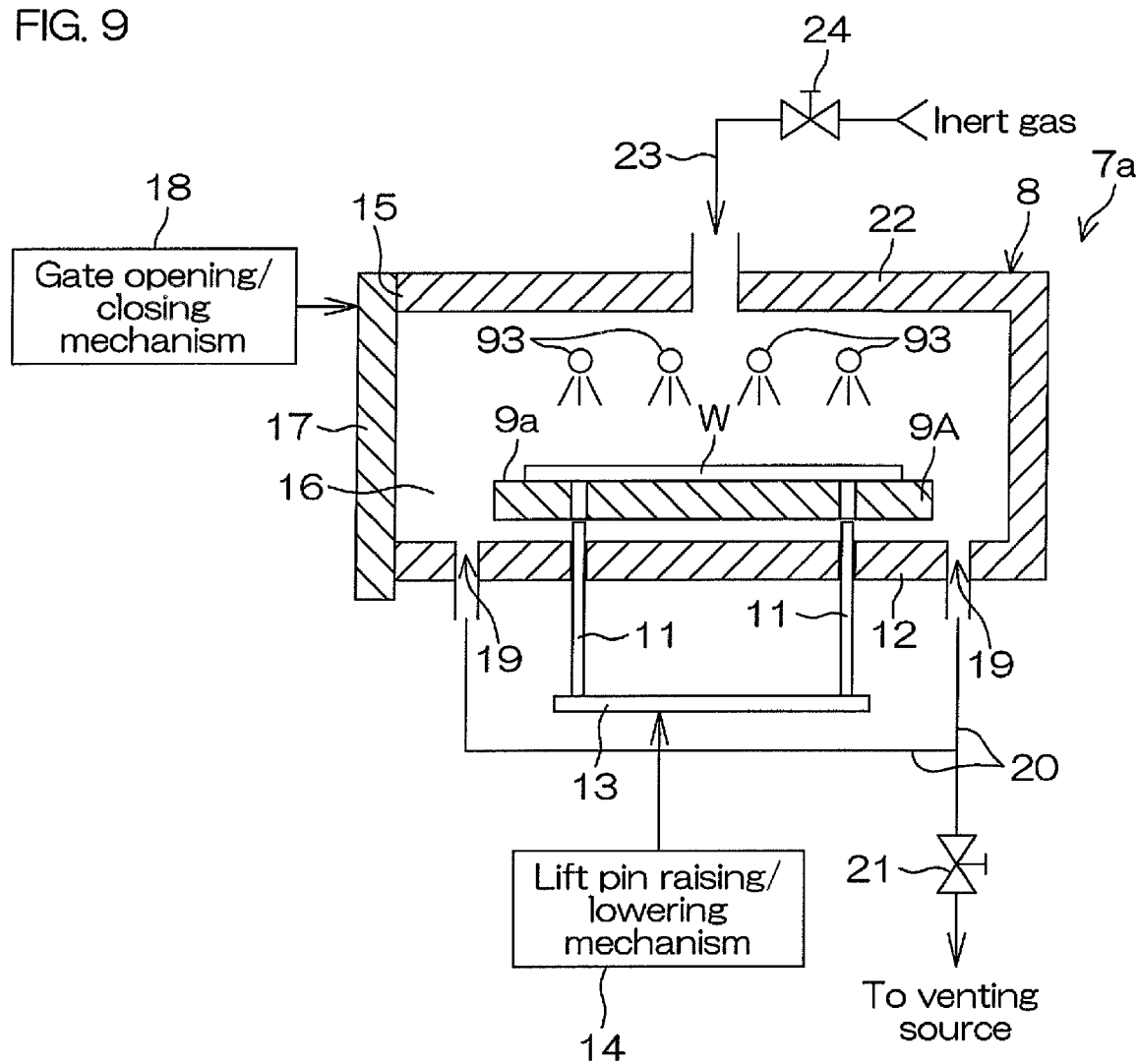
FIG. 9 shows yet another arrangement example of a water removing unit.

FIG. 9 shows yet another arrangement example of the water removing unit 7a. In FIG. 9, portions corresponding to respective portions shown in FIG. 8 described above are provided with the same reference symbols. In the present arrangement example, a heating lamp 93 (for example, a halogen lamp or a xenon flash lamp) is disposed above the substrate holding base 9A. By turning on the heating lamp 93 and irradiating and heating the substrate W by the light, the water adsorbed to the substrate W disposed on the substrate holding base 9 can be evaporated and removed instantaneously.

Figure 10:
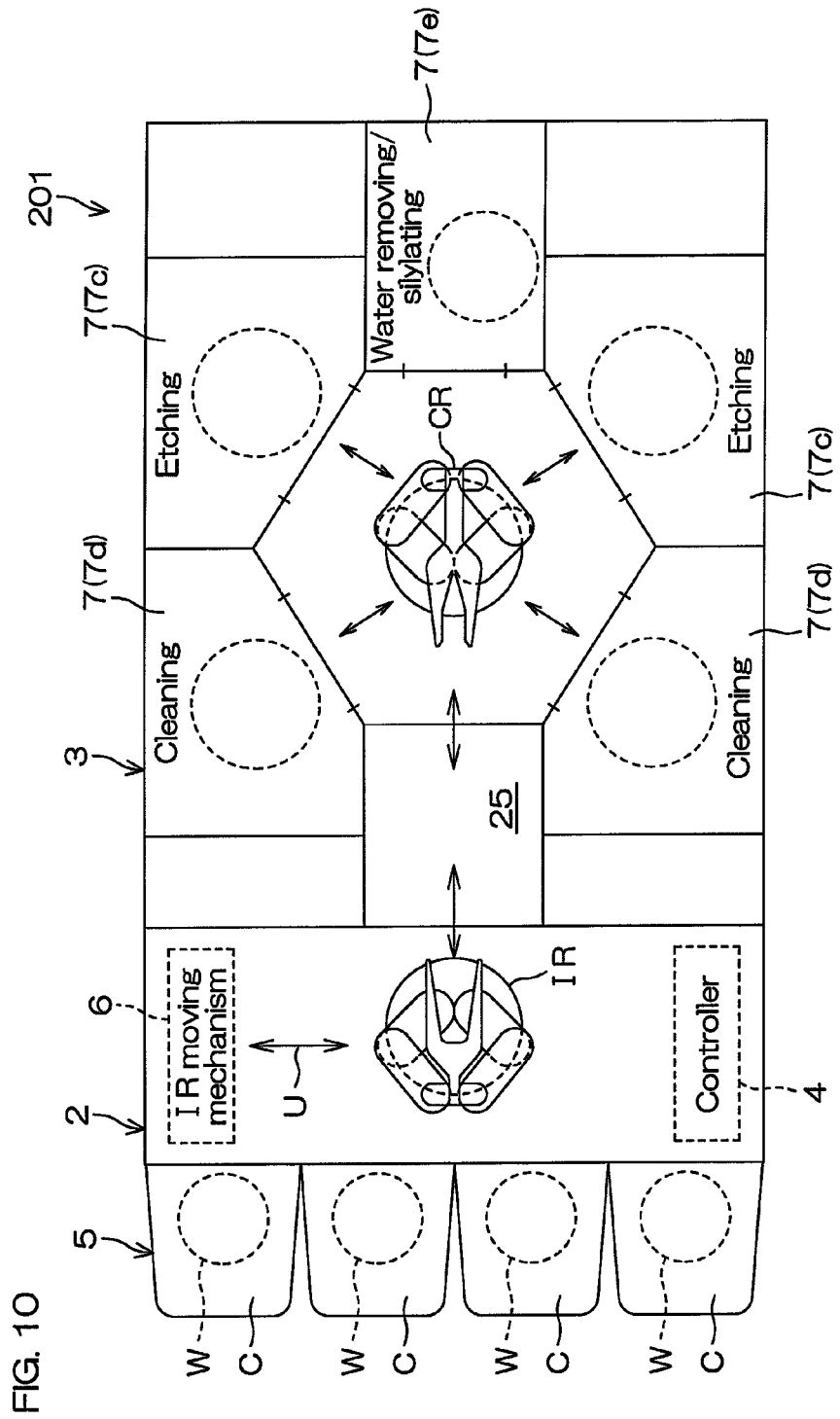
FIG. 10 is a schematic plan view of a layout of a substrate processing apparatus according to a second preferred embodiment of the present invention.

FIG. 10 is a schematic plan view of a layout of a substrate processing apparatus 201 according to a second preferred embodiment of the present invention. In FIG. 10, portions corresponding to those of FIG. 1 are provided with the same reference symbols. A principal point of difference between the second preferred embodiment and the first preferred embodiment described above is that the arrangement of the processing units differs. That is, whereas with the first preferred embodiment, a case where the plurality of processing units include the water removing unit 7a that removes the water adsorbed to the substrate W, the silylating unit 7b that silylates the substrate W, the etching unit 7c that etches the substrate W, and the cleaning unit 7d that cleans the substrate W has been described, in the second preferred embodiment, the plurality of processing units include a water removing/silylating unit 7e that silylates the surface of the substrate W after removing the adsorbed water of the substrate W. The water removing/silylating unit 7e may be a baking/silylating unit that silylates the surface of the substrate W after performing the baking process of heating the substrate W to evaporate the adsorbed water. The baking/silylating unit may have the same arrangement as the silylating unit 7b shown in FIG. 3.

To describe more specifically, the substrate processing apparatus 201 according to the second preferred embodiment includes a single water removing/silylating unit 7e, two etching units 7c, and two cleaning units 7d and these are disposed so as to surround the center robot CR in a plan view. The same processes as those of the first preferred embodiment are made possible with the present arrangement as well.

Figure 11:
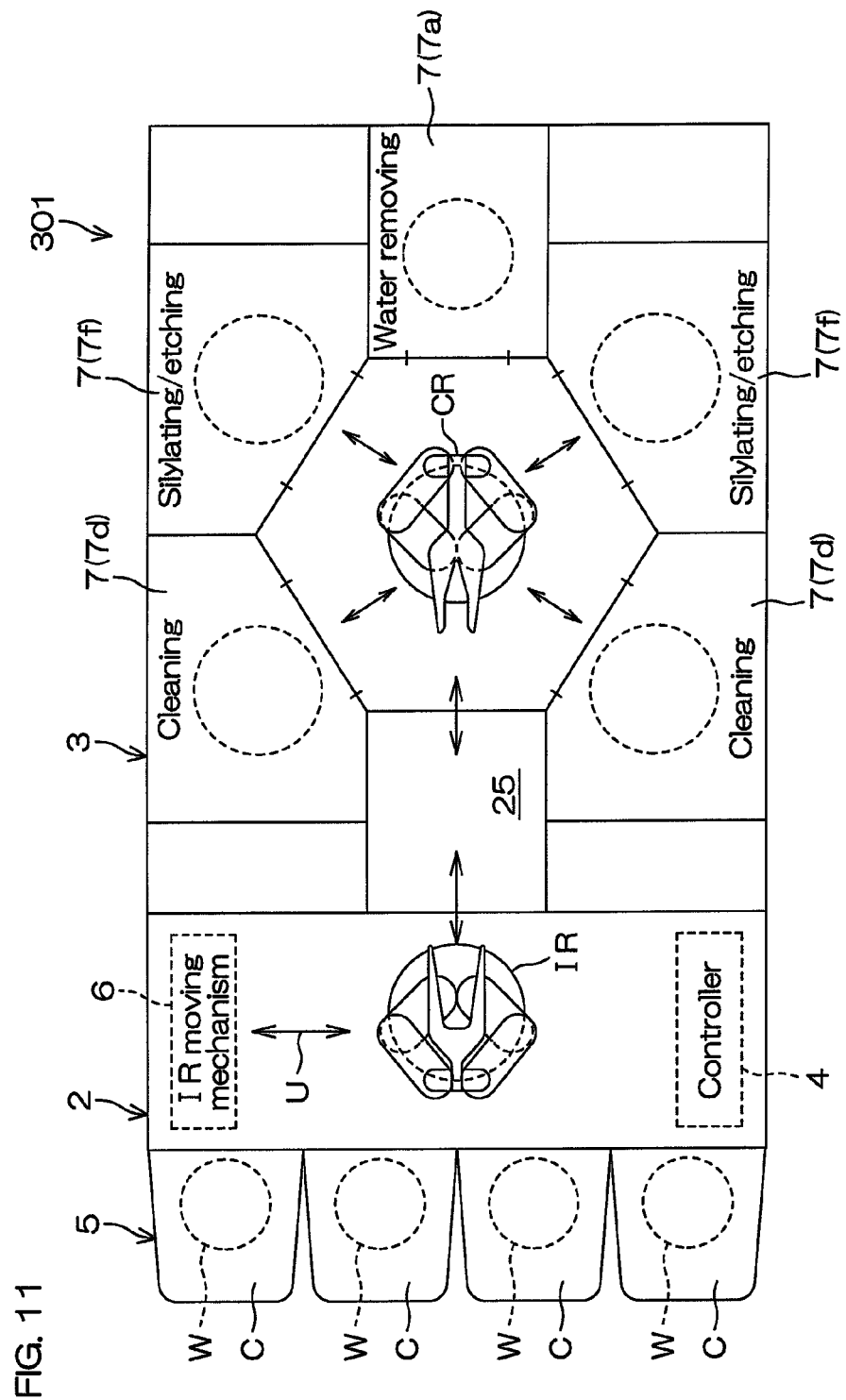
FIG. 11 is a schematic plan view of a layout of a substrate processing apparatus according to a third preferred embodiment of the present invention.

FIG. 11 is a schematic plan view of a layout of a substrate processing apparatus 301 according to a third preferred embodiment of the present invention. In FIG. 11, portions corresponding to those of FIG. 1 are provided with the same reference symbols. A principal point of difference between the third preferred embodiment and the first preferred embodiment described above is that the arrangement of the processing units differs. That is, with the third preferred embodiment, the plurality of processing units include a silylating/etching unit 7f that performs the etching process on the substrate W after silylating the surface of the substrate W.

To describe more specifically, the substrate processing apparatus 301 according to the third preferred embodiment includes a single water removing unit 7a, two silylating/etching units 7f, and two cleaning units 7d and these are disposed so as to surround the center robot CR in a plan view. The same processes as those of the first preferred embodiment are made possible with the present arrangement as well.

Figure 12:
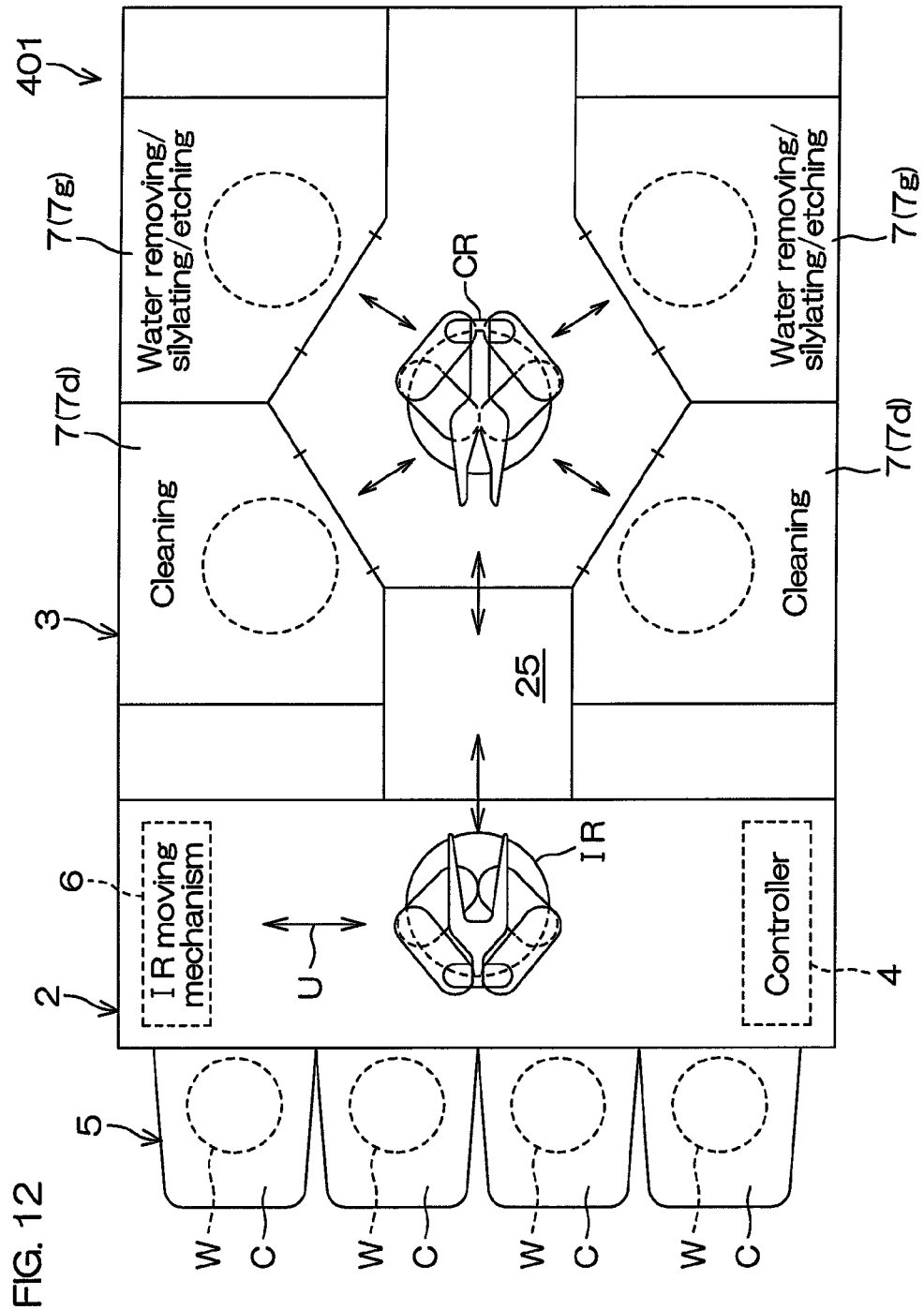
FIG. 12 is a schematic plan view of a layout of a substrate processing apparatus according to a fourth preferred embodiment of the present invention.

FIG. 12 is a schematic plan view of a layout of a substrate processing apparatus 401 according to a fourth preferred embodiment of the present invention. In FIG. 12, portions corresponding to those of FIG. 1 are provided with the same reference symbols. A principal point of difference between the fourth preferred embodiment and the first preferred embodiment described above is that the arrangement of the processing units differs. That is, with the fourth preferred embodiment, the plurality of processing units include a water removing/silylating/etching unit 7g that silylates the surface of the substrate W after removing the water adsorbed to the substrate W and thereafter performs the etching process on the substrate W. The water removing/silylating/etching unit 7g may be a baking/silylating/etching unit that silylates the surface of the substrate W after performing the baking process of heating the substrate W to make the adsorbed water evaporate and thereafter performs the etching process.

To describe more specifically, the substrate processing apparatus 401 according to the fourth preferred embodiment includes two water removing/silylating/etching units 7g and two cleaning units 7d and these are disposed so as to surround the center robot CR in a plan view. The same processes as those of the first preferred embodiment are made possible with the present arrangement as well.

Figure 13:
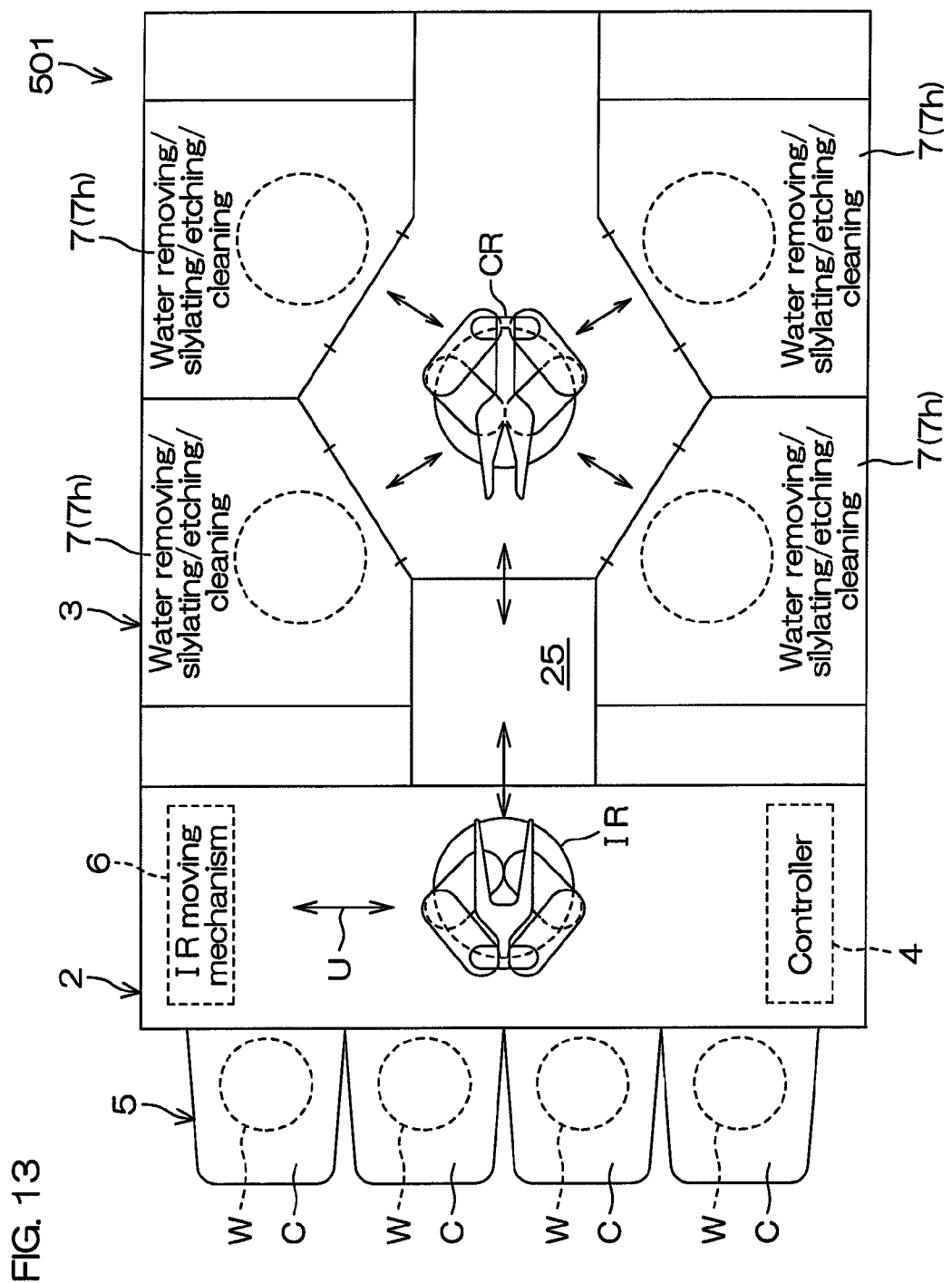
FIG. 13 is a schematic plan view of a layout of a substrate processing apparatus according to a fifth preferred embodiment of the present invention.

FIG. 13 is a schematic plan view of a layout of a substrate processing apparatus 501 according to a fifth preferred embodiment of the present invention. In FIG. 13, portions corresponding to those of FIG. 1 are provided with the same reference symbols. A principal point of difference between the fifth preferred embodiment and the first preferred embodiment described above is that the arrangement of the processing units differs. That is, with the fifth preferred embodiment, the plurality of processing units include a water removing/silylating/etching/cleaning unit 7h that silylates the surface of the substrate W after removing the water adsorbed to the substrate W, thereafter performs the etching process on the substrate W, and thereafter further executes the cleaning process of washing off the chemical solution components on the surface of the substrate W. The water removing/silylating/etching/cleaning unit 7h may be a baking/silylating/etching/cleaning unit that silylates the surface of the substrate W after performing the baking process of heating the substrate W to make the adsorbed water evaporate, thereafter performs the etching process, and thereafter further performs the cleaning process on the substrate W.

To describe more specifically, the substrate processing apparatus 501 according to the fifth preferred embodiment includes four water removing/silylating/etching/cleaning units 7h and these are disposed so as to surround the center robot CR in a plan view. The same processes as those of the first preferred embodiment are made possible with the present arrangement as well.

Figure 14:
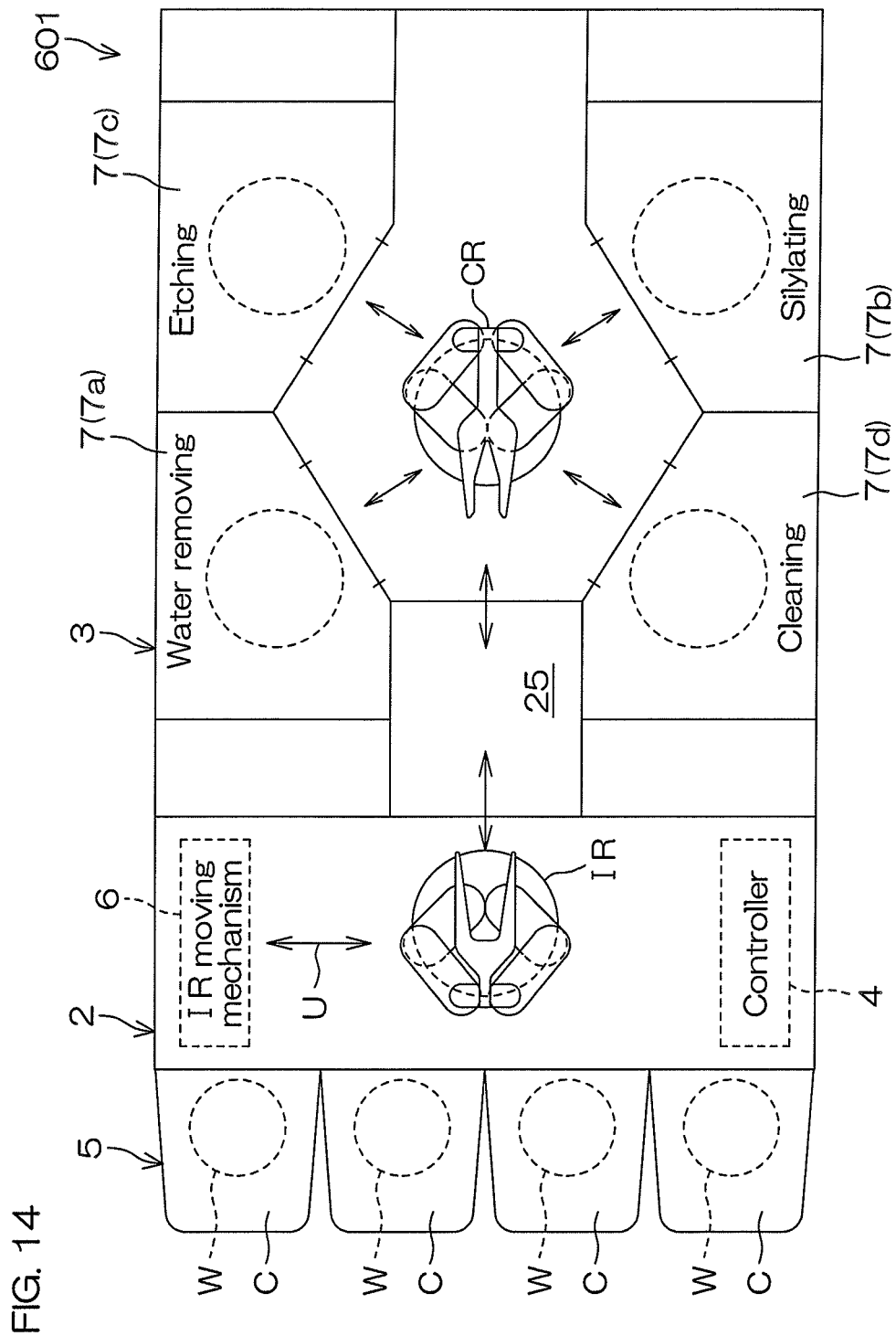
FIG. 14 is a schematic plan view of a layout of a substrate processing apparatus according to a sixth preferred embodiment of the present invention.

FIG. 14 is a schematic plan view of a layout of a substrate processing apparatus 601 according to a sixth preferred embodiment of the present invention. In FIG. 14, portions corresponding to those of FIG. 1 are provided with the same reference symbols. A principal point of difference between the sixth preferred embodiment and the first preferred embodiment described above is that the arrangement of the processing units differs. Specifically, the substrate processing apparatus 601 according to the sixth preferred embodiment includes a single water removing unit 7a, a single silylating unit 7b, a single etching unit 7c, and a single cleaning unit 7d and these are disposed so as to surround the center robot CR in a plan view. In the first preferred embodiment, the water removing unit 7a is disposed between fluid valve boxes 27 at the side opposite to the indexer block 2 side with respect to the center robot CR. On the other hand, with the substrate processing apparatus 601 according to the sixth preferred embodiment, the water removing unit 7a is disposed adjacent to a single fluid valve box 26 at the indexer block 2 side. The same processes as those of the first preferred embodiment are made possible with the present arrangement as well. However, whereas there is just a single etching unit 7c with the present preferred embodiment, the substrate processing apparatus 1 according to the first preferred embodiment includes two etching unit 7c and thus the arrangement of the first preferred embodiment is higher in productivity.

Although preferred embodiments of the present invention have been described above, the present invention may be carried out in yet other modes as well. For example, although with each of the preferred embodiments described above, a one-by-one type substrate processing apparatus that processes a substrate one at a time has been taken up as an example, the present invention can also be applied to a batch type substrate processing apparatus that processes a plurality of substrate W in a batch. Specifically, a substrate processing apparatus to which the present invention is applied may include a batch type water removing unit that performs the drying process on a plurality of substrates W in a batch, a batch type silylating unit that performs the silylating process on the plurality of substrates W in a batch, a batch type etching unit that performs the etching process on the plurality of substrates W in a batch, and a batch type cleaning unit that cleans the plurality of substrates W in a batch. The batch type silylating unit, the batch type etching unit, and the batch type cleaning unit may be arranged as a batch type processing unit in common. The batch type processing unit includes, for example, a processing tank storing a processing liquid in which the plurality of substrates W are immersed, a silylating agent supplying mechanism supplying the silylating agent to the processing tank, an etching agent supplying mechanism supplying the etching agent to the processing tank, a cleaning liquid supplying mechanism supplying a cleaning liquid to the processing tank, and a liquid discharging mechanism that discharges the liquid inside the processing tank.

Also, although with each of the preferred embodiments described above, an etching unit that performs gas phase etching where the etching agent is supplied in the form of a vapor has been taken up as an example, an etching unit that supplies an etching liquid to a substrate as the etching agent may be used instead.

Also, although with each of the preferred embodiments described above, the water removing step, the silylating step, and the etching step are performed once each, the water removing step, the silylating step, and the etching step may be performed again on a substrate W on which the water removing step, the silylating step, and the etching step have been performed. Although the etching of the oxide film is suppressed by the supplying of the silylating agent, if an etching step of long duration is performed, the effect of suppressing the etching of the oxide film decreases with the elapse of time and the selectivity ratio may decrease. Thus, in a case where an etching step of long duration is to be performed, the water removing step and the silylating step can be interposed again during the etching step to maintain a high selectivity ratio in the etching step.

Although the preferred embodiments of the present invention have been described in detail, these embodiments are merely specific examples used to clarify the technical contents of the present invention, and the present invention should not be understood as being limited to these specific examples, and the spirit and scope of the present invention are limited solely by the appended claims.

The present application corresponds to Japanese Patent Application No. 2012-77130 filed in the Japan Patent Office on Mar. 29, 2012, and the entire disclosure of this application is incorporated herein by reference.

What is claimed is:

1. A substrate processing method, wherein the substrate has a surface on which a nitride film and an oxide film are exposed, the oxide film being a hygroscopic oxide film, comprising:
   a water removing step of removing water adsorbed on the hygroscopic oxide film on the substrate;
   a silylating step of supplying a silylating agent to the substrate after the water removing step; and
   an etching step of supplying an etching agent to the substrate after the silylating step.

2. The substrate processing method according to claim 1, wherein:
   the etching step is a selective etching step of selectively etching the nitride film by the etching agent.

3. The substrate processing method according to claim 2, wherein the oxide film includes a porous silicon oxide or a low temperature oxide film.

4. The substrate processing method according to claim 1, wherein the etching agent is a vapor having an etching component.

5. The substrate processing method according to claim 4, wherein the etching component is hydrofluoric acid.

6. The substrate processing method according to claim 1, wherein the water removing step includes at least one of a heating step of heating the substrate, a pressure reducing step of reducing an atmospheric pressure ambient to the substrate, and an irradiating step of irradiating light onto the substrate.

7. The substrate processing method according to claim 1, further comprising:
   a rinsing step of supplying a rinse liquid to the substrate after the etching step has been performed; and
   a drying step of drying the substrate after the rinsing step has been performed.

8. The substrate processing method according to claim 1, further comprising: a heating step of heating the substrate in parallel to the silylating step.

* * * * *